United States Patent
Li

(10) Patent No.: US 8,013,772 B2
(45) Date of Patent: Sep. 6, 2011

(54) REDUCED AREA DIGITAL-TO-ANALOG CONVERTER

(75) Inventor: Qunying Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/651,278

(22) Filed: Dec. 31, 2009

(65) Prior Publication Data

US 2011/0156942 A1    Jun. 30, 2011

(51) Int. Cl.
*H03M 1/78* (2006.01)
(52) U.S. Cl. .......................................... 341/154; 331/81
(58) Field of Classification Search .......... 341/130–167; 333/81 R; 327/308; 381/104; 330/284, 330/254
See application file for complete search history.

(56) References Cited

U.S. PATENT DOCUMENTS

| | | | | |
|---|---|---|---|---|
| 5,969,658 A | * | 10/1999 | Naylor | 341/154 |
| 6,150,971 A | * | 11/2000 | Naylor et al. | 341/154 |
| 7,253,700 B1 | * | 8/2007 | Chiu | 333/81 R |
| 7,675,380 B2 | * | 3/2010 | Chiu | 333/81 R |
| 7,773,023 B2 | * | 8/2010 | Dosho et al. | 341/163 |
| 7,855,670 B2 | * | 12/2010 | Dosho et al. | 341/150 |

* cited by examiner

*Primary Examiner* — Lam T Mai
(74) *Attorney, Agent, or Firm* — Dawn V. Stephens; Wade James Brady, III; Frederick J. Telecky, Jr.

(57) ABSTRACT

One embodiment of the invention includes a digital-to-analog converter (DAC) system. A resistive ladder comprises a plurality of resistors having an approximately equal resistance and is arranged in a respective plurality of resistive rungs between first and second ends of the resistive ladder. The first end of the resistive ladder can be coupled to an output and at least a portion of the plurality of resistors between the first end and the second end of the resistive ladder can have a physical size that is descending size-scaled in a direction from the first end of the resistive ladder to the second end of the resistive ladder. A switching circuit is configured to connect each of the plurality of resistive rungs to one of a first voltage and a second voltage based on a binary value of a digital input signal to generate a corresponding analog output voltage at the output.

18 Claims, 12 Drawing Sheets

REDUCED AREA DIGITAL-TO-ANALOG CONVERTER

TECHNICAL FIELD

This invention relates to electronic circuits, and more specifically to a reduced area digital-to-analog converter.

BACKGROUND

Digital-to-analog conversion is becoming an increasingly important feature in many electronic devices. For example, wireless communications devices implement digital-to-analog conversion to convert digital data to an analog form for wireless transmission from an antenna, and hard disk-drive (HDD) applications implement digital-to-analog conversion for servo control of the disk-drive. Thus, digital-to-analog converter (DAC) circuits have been developed to provide digital-to-analog conversion for any of a variety of electronic device applications. However, there is an increasing demand for integrated circuits (ICs) to be fabricated to have a reduced silicon area for the manufacture of smaller and lower cost electronic devices.

Additional design considerations for a given DAC circuit can include differential non-linearity (DNL), which can be associated with resolution, and integral non-linearity (INL), which can be associated with accuracy. A variety of DAC circuits implement resistors, such as poly-silicon resistors, to generate the analog version of the digital input signal. Designers of typical DAC ladder circuits typically design the resistors to be of a sufficient physical size for proper resistance matching of the resistors, such that error associated with DNL and/or INL can be substantially mitigated.

SUMMARY

One embodiment of the invention includes a digital-to-analog converter (DAC) system. A resistive ladder comprises a plurality of resistors having an approximately equal resistance and is arranged in a respective plurality of resistive rungs between first and second ends of the resistive ladder. The first end of the resistive ladder can be coupled to an output and at least a portion of the plurality of resistors between the first end and the second end of the resistive ladder can have a physical size that is descending size-scaled in a direction from the first end of the resistive ladder to the second end of the resistive ladder. A switching circuit is configured to connect each of the plurality of resistive rungs to one of a first voltage and a second voltage based on a binary value of a digital input signal to generate a corresponding analog output voltage at the output.

Another embodiment of the invention includes an R-2R DAC system. The system includes a digital register configured to receive a digital input signal having a plurality X of bits, where X is a positive integer. The system also includes an R-2R resistive ladder comprising a plurality of resistors having an approximately equal resistance and being arranged in a respective plurality of resistive rungs. Each of the plurality of resistive rungs can be connected between a switching node and a respective second node. The second node of at least one adjacent pair of the plurality of resistive rungs can be connected by one of the plurality of resistors. At least a portion of the plurality of resistors in the R-2R resistive ladder can have a physical size that is descending size-scaled in a given direction between ends of the resistive ladder. The system further includes a switching circuit comprising a plurality of switches configured to connect each of the plurality of resistive rungs to one of a first voltage and a second voltage in response to respective bits in the digital input signal.

Another embodiment of the invention includes an R-2R DAC system. The system includes a digital register configured to store a digital input signal having a plurality X of bits ranging from a most significant bit (MSB) to a least significant bit (LSB), where X is a positive integer. The system also includes a binary R-2R resistive ladder comprising a plurality of resistive rungs. Each of the plurality of resistive rungs can comprise a pair of series resistors connected between a respective switching node and a respective second node. The respective second nodes of at least some adjacent pairs of the plurality of resistive rungs can be interconnected by an interconnecting resistor. Each of the series resistors and interconnecting resistors in the resistive ladder can have an approximately equal resistance. The series resistors and interconnecting resistors of at least a portion of the plurality of resistive rungs can have a physical size that decreases in a direction from the MSB to the LSB. The system further includes a switching circuit. The switching circuit includes a plurality of drivers, each of the plurality of drivers being configured to generate a switching signal that is based on a value of a respective one of the X bits of the digital input signal in the digital register. The switching circuit also includes a plurality of switches configured to connect the switching node of each of the plurality of resistive rungs to one of a first voltage and a second voltage based on the switching signal provided by a respective one of the plurality of drivers to generate an analog output voltage at an output of the resistive ladder.

DETAILED DESCRIPTION

The invention relates to electronic circuits, and more specifically to a reduced area digital-to-analog converter (DAC).

A DAC circuit can be configured as an R-2R DAC circuit that includes a descending size-scaled R-2R resistive ladder. The R-2R resistive ladder can include a plurality of rungs that each includes a pair of resistors, and the rungs can each be separated by another resistor. Each of the rungs is coupled to either a high-voltage rail or a low-voltage rail based on a digital value of a digital input signal to generate an analog output voltage. All of the resistors in the resistive ladder can have nominally the same resistance. However, at least a portion of the resistors in the plurality of rungs can have a physical size that is descending size-scaled from one or more of the rungs that correspond to at least one most significant bit (MSB) to the least significant bit (LSB). Therefore, the R-2R resistive ladder can be fabricated at a significantly reduced size, and thus reduced cost, than conventional R-2R resistive ladders while still maintaining sufficient accuracy.

Figure 1:
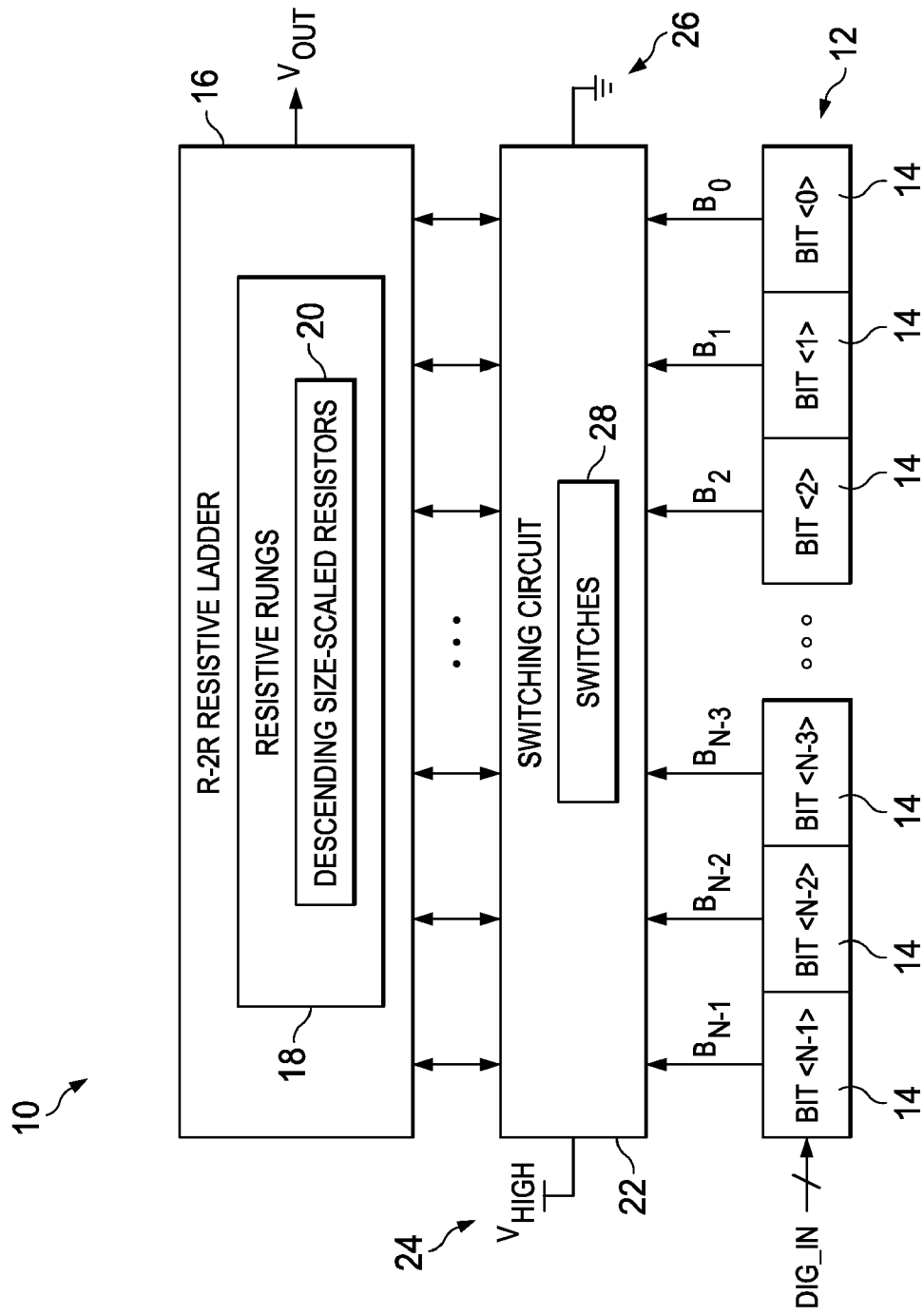
FIG. 1 illustrates an example of an R-2R digital-to-analog converter (DAC) system in accordance with an aspect of the invention.

FIG. 1 illustrates an example of an R-2R digital-to-analog converter (DAC) system 10 in accordance with an aspect of the invention. The R-2R DAC system 10 can be implemented in any of a variety of electronic device applications. As an example, the R-2R DAC system 10 can be implemented in a successive approximation register (SAR) analog-to-digital converter (ADC), such as can be provided in a hard disk-drive (HDD) servo control or other integrated circuit (IC). Thus, the R-2R DAC system 10 can be fabricated as a portion of an IC.

The R-2R DAC system 10 includes a digital register 12 that stores a digital input signal DIG_IN having N bits, where N is a positive integer. In the example of FIG. 1, the digital register 12 stores the N bits ranging from a most significant bit (MSB) of <N−1> to a least significant bit (LSB) of <0>. The digital register 12 can be a portion of a memory structure, such as any of a variety of random access memory (RAM) structures. Thus, each bit of the digital input signal DIG_IN is demonstrated in the example of FIG. 1 as being stored in a respective cell 14. Therefore, each of the cells 14 stores a digital bit value, demonstrated in the example of FIG. 1 as $B_{N-1}$ to $B_0$, that corresponds to each respective bit of the digital input signal DIG_IN.

The R-2R DAC system 10 also includes a resistive ladder that is demonstrated in the example of FIG. 1 as an R-2R resistive ladder 16. The R-2R resistive ladder 16 comprises a plurality of resistive rungs 18 that comprises a plurality of resistors 20. As an example, each of the resistive rungs 18 can include a pair of series resistors 20 that extend between a switching node and an intermediate node, and a single resistor 20 can interconnect the intermediate nodes of adjacent pairs of the resistive rungs 18 of at least a portion of the R-2R resistive ladder 16. The resistors 20 can be poly-silicon resistors (e.g., thin-film resistors).

The R-2R DAC system 10 further includes a switching circuit 22 that is configured to connect the switching node of each of the resistive rungs 18 of the R-2R resistive ladder 16 to one of a high-voltage rail 24, demonstrated in the example of FIG. 1 as having a voltage $V_{HIGH}$, and a low-voltage rail 26, demonstrated in the example of FIG. 1 as ground. The switching of each of the resistive rungs 18 of the R-2R resistive ladder 16 can be in response to the digital bit signals $B_{N-1}$ through $B_0$. For example, the switching circuit 22 can include a plurality of drivers configured to buffer the digital bit signals into switching signals that control a set of switches 28 for each of the plurality of resistive rungs 18 of the R-2R resistive ladder 16. Therefore, based on the coupling of the resistive rungs 18 to the high or low-voltage rails 24 and 26, the R-2R DAC circuit 10 generates an analog output voltage $V_{OUT}$ based on the digital value of the digital input signal DIG_IN.

As an example, all of the resistors 20 can have nominally the same resistance. However, circuit fabrication process and temperature variations can result in slight variations in the resistance matching of each of the resistors 20 of one resistive rung 18 relative to the others. The variation in resistance matching of the resistors 20 can result in a differential non-linearity (DNL) error and an Integral Non-Linearity error (INL) in the magnitude of the analog output voltage $V_{OUT}$. Specifically, DNL error is a difference between an actual step magnitude and an ideal step magnitude of the analog output voltage $V_{OUT}$. As described herein, a step is defined as the magnitude change of the DAC output voltage when the DAC input moves from any one code (e.g., DIG_IN=X) to a next code (e.g., DIG_IN=X+1). INL error is the integral of the DNL curve over the input code range. In order to maintain sufficient resolution of the R-2R DAC system 10, it is desirable to maintain a DNL error and INL error to within a predetermined fractional portion (e.g., +/−0.5) of an analog magnitude of one LSB.

The DNL and INL error of an R-2R DAC are typically proportional to a resistor matching level. The matching level (σ) of resistors located in a close proximity is inversely proportional to a physical area size of the resistors, as demonstrated below:

$$\sigma \propto \frac{1}{\sqrt{WL}}$$ Equation 1

Where: W and L are the respective width and the length of the resistor.

Thus, to set the DNL error to within specification, the physical area of the resistors needs to be greater than a specific amount. However, when the resistor area is large, the matching level of the resistors that are not located in close proximity become poor due to the wafer, stress, and temperature gradients that exist in a given silicon integrated circuit (IC).

To substantially mitigate resistor DAC resistor area while maintaining DNL error to within specification, the resistors 20 are demonstrated in the example of FIG. 1 as being descending size-scaled resistors 20. As used herein, the term "descending size-scaling" and variations of this term describes a decrease in physical size of the resistors 20 in one or more of the resistive rungs 18 in a direction from an end of the resistive ladder 16 corresponding to the output $V_{OUT}$ toward the opposing end of the resistive ladder 16. From the perspective of the digital input signal DIG_IN, the descending size-scaling, which may be gradual, stepped, incremental, or otherwise, results in resistors 20 of a larger physical size at the resistive rungs 18 associated with the MSBs relative to the size of the resistors 20 at some or all of the resistive rungs 18 associated with the LSBs. Therefore, the resistors 20 can be descending in size-scaling based on a descending physical size of the resistors 20 in and between each of the resistive rungs 18. Consecutive resistive rungs 16 can be descending size-scaled, or consecutive groups of the resistive rungs 16 can be descending size-scaled. As an example, at least a portion of the resistors 20 can be descending size-scaled from the resistive rungs 18 corresponding to one or more of the MSBs of the digital input signal DIG_IN consecutively to the resistive rung 18 corresponding to the LSB of the digital input signal DIG_IN.

For example, the R-2R resistive ladder 16 can include a single resistive rung 18 for each bit of the digital input signal DIG_IN. Thus, the resistor 20 of the resistive rung 18 corresponding to the MSB of the digital input signal DIG_IN can have a specific physical size for maintaining a sufficient DNL error of approximately +/−0.5 an analog magnitude of the LSB at a given one step transition of the digital input signal DIG_IN. The resistors 20 in the remaining resistive rungs 18 can thus have a physical size that is descending size-scaled from the physical size of the resistive rung 18 of the MSB, such as by a power of two, down to a minimum fabrication size for a poly-silicon resistor 20. Other mathematical relationships (e.g., linear or non-linear) can be implemented to provide desired descending size-scaling of the resistors 20. As a result, the silicon area of the R-2R DAC system 10 can be substantially reduced based on the significant decrease in the physical size of the resistors 20 resulting from the descending size-scaling.

Figure 2:
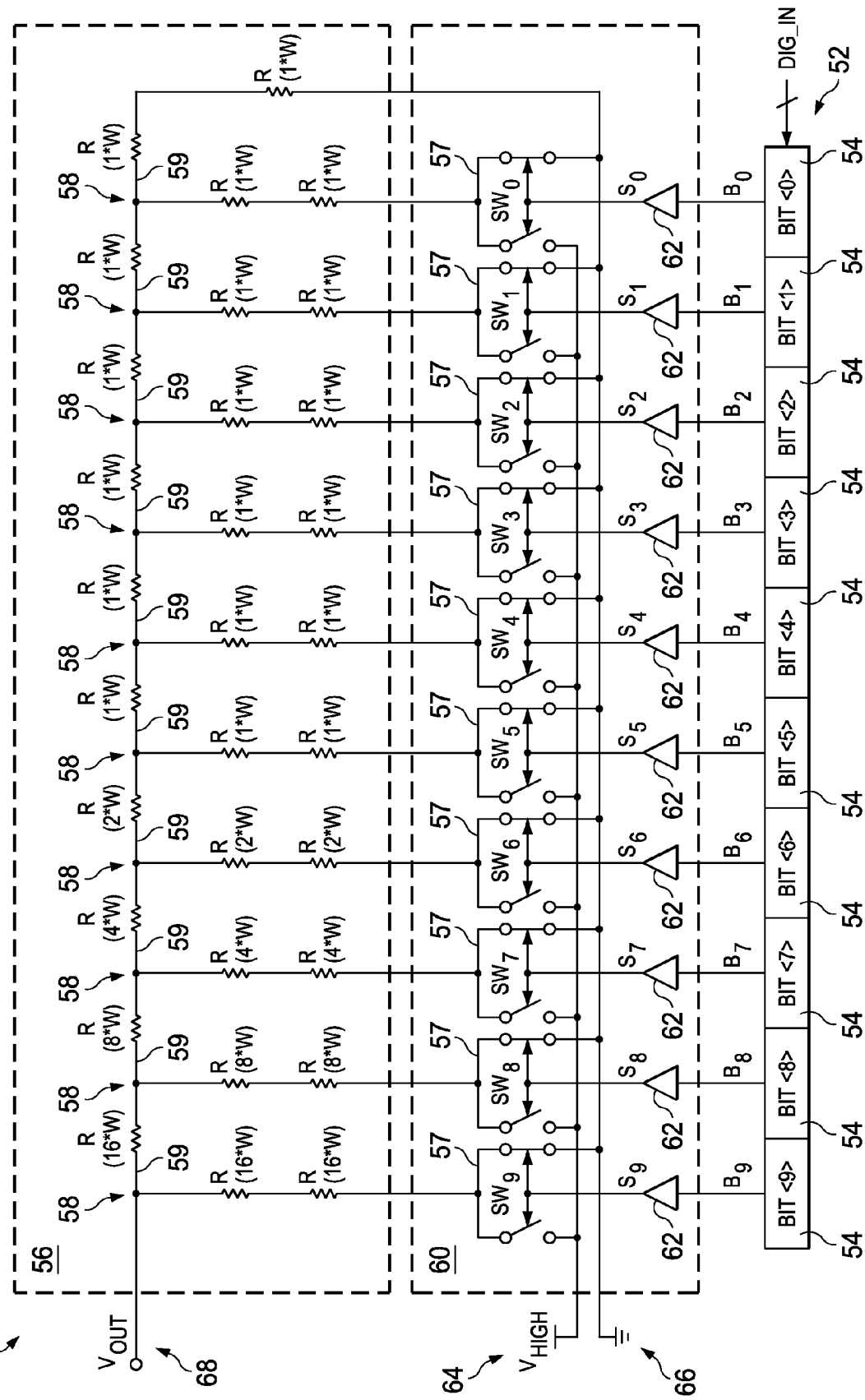
FIG. 2 illustrates an example of an R-2R DAC circuit in accordance with an aspect of the invention.

FIG. 2 illustrates an example of an R-2R DAC circuit 50 in accordance with an aspect of the invention. The R-2R DAC circuit 50 includes a digital register 52 that receives a 10-bit digital input signal DIG_IN. The digital register 52 can be a portion of a memory structure, such as any of a variety of RAM structures. Thus, each of the bits of the digital input signal DIG_IN is stored in a corresponding memory cell 54 of the digital register 52. In the example of FIG. 2, the memory cells 54 of the digital register 52 are arranged from an MSB of <9> to an LSB of <0>, although it is to be understood that other numbers of bits can be utilized. Thus, each of the memory cells 54 generates a digital bit signal, demonstrated in the example of FIG. 2 as $B_9$ to $B_0$, that corresponds to the binary value of each of the respective ten bits of the digital input signal DIG_IN.

The R-2R DAC circuit 50 also includes an R-2R resistive ladder 56. The R-2R resistive ladder 56 comprises a plurality of resistive rungs 58 that comprises a plurality of resistors, demonstrated in the example of FIG. 2 as "R". In the example of FIG. 2, the resistive rungs 58 extend between a switching node 57 and an intermediate node 59. Adjacent pairs of the intermediate nodes 59 are each separated by a single resistor R, and each of the resistive rungs 58 includes a pair of series resistors R. As an example, the resistors R can be poly-silicon resistors (e.g., thin-film resistors). Each of the resistors R can have approximately equal resistance.

The R-2R DAC circuit 50 further includes a switching circuit 60. The switching circuit 60 includes a plurality of drivers 62 that are configured to drive the digital bits $B_9$ through $B_0$ to generate respective switching signals demonstrated as $S_9$ through $S_0$. The switching signals $S_9$ through $S_0$ are provided to respective sets of switches demonstrated as $SW_9$ through $SW_0$. In the example of FIG. 2, the switches $SW_9$ through $SW_0$ are configured to connect each of the resistive rungs 58 of the R-2R resistive ladder 56 to either a high-voltage rail 64, demonstrated in the example of FIG. 2 as having a voltage $V_{HIGH}$, or a low-voltage rail 66, demonstrated in the example of FIG. 2 as ground. For example, a logic-high binary value of the switching signals $S_9$ through $S_0$ can activate the respective switches $SW_9$ through $SW_0$ to couple the switching nodes 57 of the respective resistive rungs 58 to the high-voltage rail 64. Conversely, a logic-low binary value of the switching signals $S_9$ through $S_0$ can activate the respective switches $SW_9$ through $SW_0$ to couple the switching nodes 57 of the respective resistive rungs 58 to the low-voltage rail 66. Therefore, based on the coupling of each of the switching nodes 57 to the high or low-voltage rails 64 and 66, the R-2R DAC circuit 50 generates a corresponding analog output voltage $V_{OUT}$ at an output 68 based on the digital value of the digital input signal DIG_IN.

As described above, all of the resistors R can have nominally the same resistance, but circuit fabrication process and temperature variations can result in slight deviations in the resistance matching of each of the resistors R. The deviations in resistance matching of the resistors R can thus result in DNL error in the magnitude of the analog output voltage $V_{OUT}$, such as for a given transition from one digital code to a next digital code. For example, the transition of the digital input signal DIG_IN can be between a first value in which an MSB has a first logic state and all bits of lesser significance have a second logic state, and a second value in which the same MSB has the second logic state and all the other bits have the first logic state. This transition is thus an increment/decrement by one LSB to reverse binary states of the MSB and the other lesser significant bits.

Figure 3:
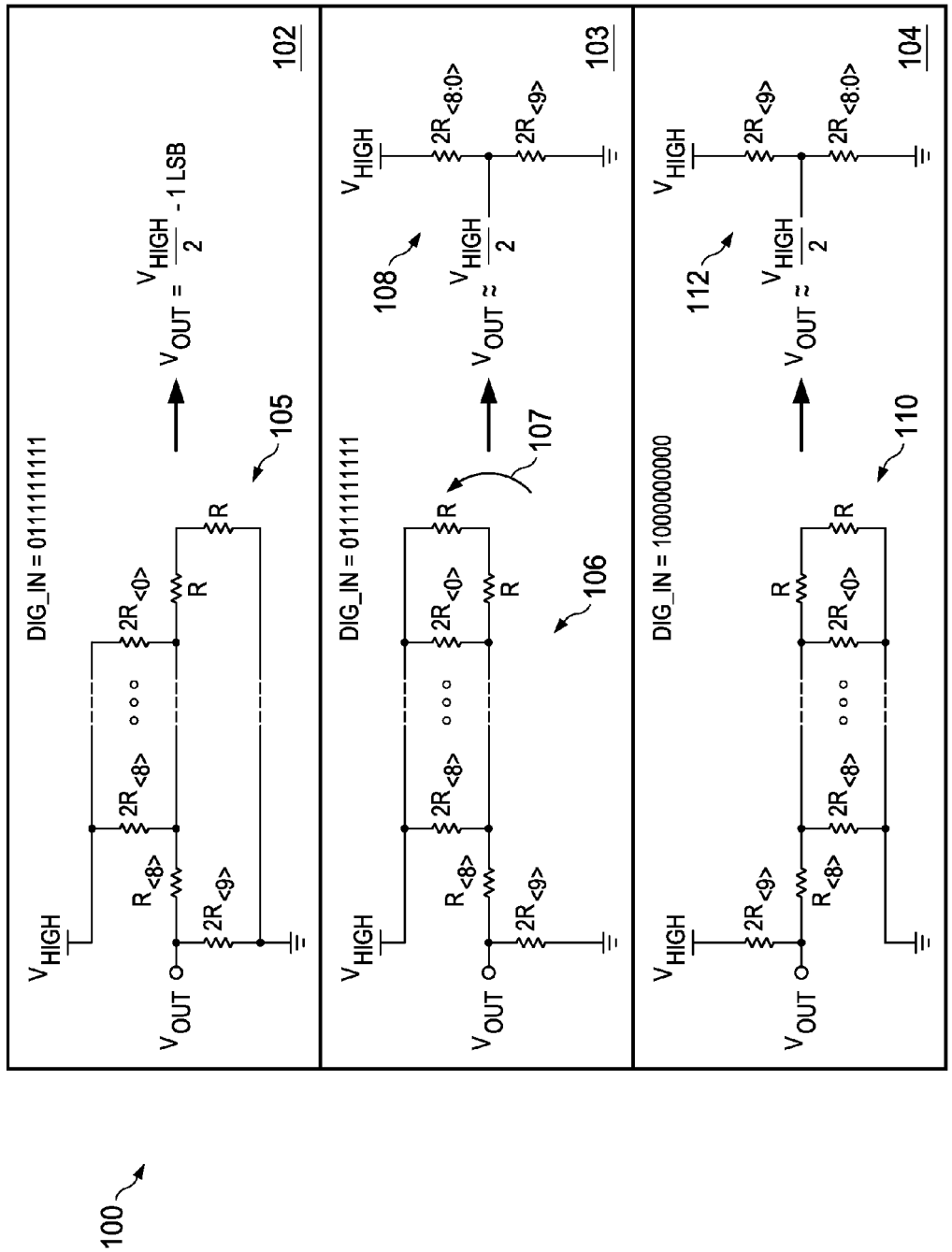
FIG. 3 illustrates an example of a diagram demonstrating a most significant bit (MSB) transition of the R-2R DAC circuit of the example of FIG. 2 in accordance with an aspect of the invention.

For example, in a 10 bit R-2R DAC, the <9> transition describes the transition from a digital input code DIG_IN='0111111111' to a digital input code DIG_IN='1000000000'. The <8> transition describes the transition from the digital input code 'X011111111' to the digital input code 'X100000000', where 'X' can be either "0" or "1", etc. for all transitions down to the <0> transition, defined as a transition of a digital input code 'XXXXXXXXX0' to a digital input code 'XXXXXXXXX1', where X can be either "0" or "1" in all of above examples FIG. 3 illustrates an example of a diagram 100 demonstrating an MSB transition of the R-2R DAC circuit 50 of the example of FIG. 2 in accordance with an aspect of the invention. Thus, because the diagram 100 demonstrates the R-2R DAC circuit 50, reference is to be made to the example of FIG. 2 in the following description of FIG. 3.

The diagram 100 demonstrates a first schematic representation 102 and a second schematic representation 103 of the R-2R resistive ladder 56 of FIG. 2, each having a first logic state that corresponds to the digital input signal DIG_IN='0111111111'. The diagram 100 also demonstrates a third schematic representation 104 of the R-2R resistive ladder 56 of FIG. 2 having a second logic state that corresponds to a digital value of the digital input signal DIG_IN of '1000000000'. Therefore, the diagram 100 demonstrates a transition of the digital input signal DIG_IN as a change from the digital value '0111111111' to the digital value '1000000000'.

In the example of FIG. 3, the first schematic representation 102 demonstrates a circuit 105 in which the R-2R resistive ladder 56 is configured such that the resistive rung 58 corresponding to the MSB (i.e., bit <9>) is coupled to ground and the remaining resistive rungs 58 are coupled to the voltage $V_{HIGH}$. It is to be understood that, in the example of FIG. 3, the series pair of resistors R in each resistive rung 58 is demonstrated as "2R", such that the resistive rung 58 corresponding to the MSB is demonstrated as $2R_{<9>}$. The output voltage $V_{OUT\_105}$ of the circuit 105 is thus approximately equal to $(V_{HIGH}/2)-1$ LSB.

The second schematic representation 103 demonstrates a circuit 106 that is modified from circuit 105. Specifically, the circuit 106 is formed by disconnecting the resistive rung at the right-most position of the circuit 105 from ground and connecting it to the voltage $V_{HIGH}$, as indicated by the arrow 107. It is to be understood that the switching of the resistive rung from ground to the voltage $V_{HIGH}$ is a theoretical manipulation of the circuit 105 for purposes of measuring DNL error, as demonstrated in greater detail below. However, such a switching can be implemented by actual circuit devices, such as a dummy switch that always couples the resistive rung to ground during normal operation of the R-2R resistive ladder 56.

As a result of the switching of the right-most resistive rung from ground to the voltage $V_{HIGH}$, the output voltage $V_{OUT}$ is increased by a voltage that is one LSB greater than the circuit 105. The circuit 106 is demonstrated as a simplified circuit 108, in which the resistors 2R of the remaining resistive rungs 58 coupled to the voltage $V_{HIGH}$ simplify to a resistor 2R corresponding to the bits <8> through <0> (i.e., $2R_{<8:0>}$) based on parallel coupling. Because the magnitude of the output voltage $V_{OUT}$ of the circuit 106 is increased by a voltage that is one LSB greater than the circuit 105, the output voltage $V_{OUT}$ would be equal to $V_{HIGH}/2$ if the resistors $2R_{<8:0>}$ and the resistors $2R_{<9>}$ were perfectly matched. However, the output voltage $V_{OUT\_106}$ of the circuit 106 can be properly expressed as follows:

$$V_{OUT\_106} = \frac{2R_{(9)}}{2R_{(9)} + 2R_{(8:0)}} * V_{HIGH} \quad \text{Equation 2}$$

The third schematic representation 104 demonstrates a circuit 110 in which the R-2R resistive ladder 56 is configured such that the resistive rung 58 corresponding to the MSB (i.e., bit <9>) is coupled to the voltage $V_{HIGH}$ and the remaining resistive rungs 58, including the resistive rung at the rightmost position of the circuit 110, are coupled to ground. The circuit 110 is demonstrated as a simplified circuit 112, in which the resistors 2R of the remaining resistive rungs 58 coupled to ground simplify to a resistor 2R corresponding to the bits <8> through <0> (i.e., <8:0>) based on parallel coupling. Therefore, the analog output voltage $V_{OUT}$ would likewise have a magnitude of $V_{HIGH}/2$ if the resistors $2R_{<8:0>}$ and the resistors $2R_{<9>}$ were perfectly matched. However, the output voltage $V_{OUT\_110}$ of the circuit 110 can be expressed as follows:

$$V_{OUT\_110} = \frac{2R_{(8:0)}}{2R_{(9)} + 2R_{(8:0)}} * V_{HIGH} \quad \text{Equation 3}$$

As demonstrated in the example of FIG. 3, upon a transition of the digital input signal DIG_IN from 0111111111 to 1000000000, the resistive rung 58 corresponding to the MSB (i.e., $2R_{<9>}$) and the remaining resistive rungs (i.e., $2R_{<8:0>}$) switch their connections between ground and the voltage $V_{HIGH}$. Ideally, the analog output voltage $V_{OUT}$ after the transition (i.e., DIG_IN='1000000000' as demonstrated in the third schematic representation 104) is greater than the analog output voltage $V_{OUT}$ before the transition (i.e., DIG_IN='0111111111' demonstrated in the first schematic representation 102) by an analog magnitude of exactly 1 LSB if all the resistors were perfectly matched. However, the actual step of the transition may deviate from the exact 1 LSB step based on a mismatch between $2R_{<9>}$ and $2R_{<8:0>}$. The error between the actual step and the ideal step is defined as the DNL of the <9> transition. Specifically, the DNL error of the transition from the code DIG_IN='0111111111' to the code DIG_IN='1000000000' demonstrated in the example of FIG. 3 can be calculated as follows:

$$DNL_{<9>transition} = V_{OUT\_AFTER} - V_{OUT\_BEFORE} \quad \text{Equation 4}$$

Equation 4 can be expressed as the actual step amplitude when the input code DIG_IN transitions from '0111111111' to '1000000000' minus the ideal step amplitude when the input code DIG_IN transitions from '0111111111' to '1000000000'. Therefore, Equation 4 can be rewritten as follows:

$$= (V_{OUT\_110} - V_{OUT\_105}) + 1LSB \quad \text{Equation 5}$$

$$= V_{OUT\_110} - (V_{OUT\_105} + 1LSB) \quad \text{Equation 6}$$

$$= V_{OUT\_110} - V_{OUT\_106} \quad \text{Equation 7}$$

$$= \frac{2R_{(8:0)}}{2R_{(9)} + 2R_{(8:0)}} * V_{HIGH} - \frac{2R_{(9)}}{2R_{(9)} + 2R_{(8:0)}} * V_{HIGH} \quad \text{Equation 8}$$

$$\approx \frac{1}{2}\left(\frac{2R_{(8:0)}}{2R_{(9)}} - 1\right) * V_{HIGH} \quad \text{Equation 9}$$

$$= \frac{1}{2}\Delta(2R_{(9)}, 2R_{(8:0)}) * V_{HIGH} \quad \text{Equation 10}$$

The DNL error demonstrated by the above Equations is caused because resistor $2R_{<9>}$ and the lumped resistor $2R_{<8:0>}$ swap their connections between the voltage $V_{HIGH}$ and ground, and both the resistor $2R_{<9>}$ and the lumped resistor $2R\_8{:}0{>}$ represent $V_{HIGH}/2$ at the DAC output. In other words, switching the resistor $2R_{<9>}$ and the lumped resistor $2R\_8{:}0{>}$ between the voltage $V_{HIGH}$ and ground results in a change of magnitude of the output voltage $V_{OUT}$ (i.e., $V_{HIGH}/2$) at the DAC output. In Equation 10, the term "$\Delta(2R_{<9>}, 2R_{<8:0>})$" is representative of a normalized resistance mismatch error between the resistors $2R_{<9>}$ and $2R_{<8:0>}$, which can be modeled as a Gaussian distribution with a zero mean and a standard deviation σ that is expressed as follows:

$$\sigma = \frac{\sigma_0}{\sqrt{WL}} \quad \text{Equation 11}$$

Where:
  $\sigma_0$ is a standard matching deviation of a unit area resistor;
  L is the length of the resistor; and
  W is the width of the resistor.

By applying similar calculations to transitions of the sequence of bits of the digital input signal DIG_IN from the MSB to the LSB (e.g., <8> transition from input code DIG_IN='X011111111' to 'X100000000', <7> transition from input code DIG_IN='XX01111111' to 'XX10000000', <6> transition from XXX0111111 to XXX1000000, etc.), it can be determined that, for the 10-bit digital input signal DIG_IN, the contribution of DNL error due to the resistance mismatch of the resistors R associated with a given input bit <i> is binary down-scaled from the MSB to the LSB. Specifically, the DNL error for a given transition of bit <i> can be expressed as follows:

$$DNL_{(i)transition} \approx \frac{1}{2^{(10-i)}} * \Delta(2R_{(X)}, 2R_{(Y)}) * V_{HIGH} \quad \text{Equation 12}$$

Where: $\Delta(2R_{<X>}, 2R_{<Y>})$ is a resistance mismatch between the sets of resistors $2R_{<X>}, 2R_{<Y>}$ that switch positions in being coupled to ground and the voltage $V_{HIGH}$ during the <bit_i> transition.

Therefore, based on Equation 6, it is determined that the transition demonstrated in the example of FIG. 3 can result in the greatest contribution to DNL error based on resistance mismatching of the resistors R in the resistive rung 58 corresponding to the MSB.

The physical size of the resistors R has an effect on the resistance matching. Specifically, larger sized resistors R typically exhibit better resistance matching than smaller sized resistors R. Because it is determined that the resistors R in the resistive rung 58 that are associated with the MSB can have the greatest contribution to DNL error, these resistors R can be fabricated at a size that ensures resistance matching sufficient to substantially minimize DNL error. As an example, the resistors R in the resistive rung 58 that is associated with the MSB can be fabricated at a specific size that is sufficient to maintain a DNL error within a predetermined fractional part (e.g., approximately +/−0.5) of an analog magnitude of the LSB at the transition of the digital input signal DIG_IN demonstrated in the example of FIG. 3. However, because the contribution of DNL error due to the resistance mismatch of the resistors R is down-scaled from the MSB to the LSB, as demonstrated in Equation 12, the resistors R in the sequence of the resistive rungs 58 can be descending size-scaled from the MSB to the LSB, thereby decreasing the overall DAC area of the resulting IC without compromising DNL performance.

Referring back to the example of FIG. 2, the R-2R resistive ladder 56 is demonstrated as comprising resistors R that are descending size-scaled in physical size. Specifically, the resistors R in the resistive rung 58 corresponding to the MSB, as well as the resistor R that interconnects to the next resistive rung 58, have a physical size (16*W). As described herein, "W" can correspond to a minimum fabrication physical size (i.e., width) of the resistors R. For the 10-bit R-2R DAC circuit 50 in the example of FIG. 2, the physical size (16*W) of the resistors in the resistive rung 58 corresponding to the MSB can be a specific physical size sufficient to maintain the DNL error within a predetermined fractional part (e.g., approximately +/−0.5) of an analog magnitude of the LSB at the transition demonstrated in the example of FIG. 3, such as based on Equation 5. The resistors R in the next resistive rung 58 in the sequence (i.e., the next lesser significant bit, bit <8>), as well as the resistor R that interconnects to the next resistive rung 58, have a physical size (8*W). Thus, the resistors R are descending size-scaled by a power of two down to the minimum fabrication size for a poly-silicon resistor of (1*W) at the resistive rung 58 corresponding to bit <5>, at which the remainder of the resistors R all have a physical size of (1*W).

Figure 4:
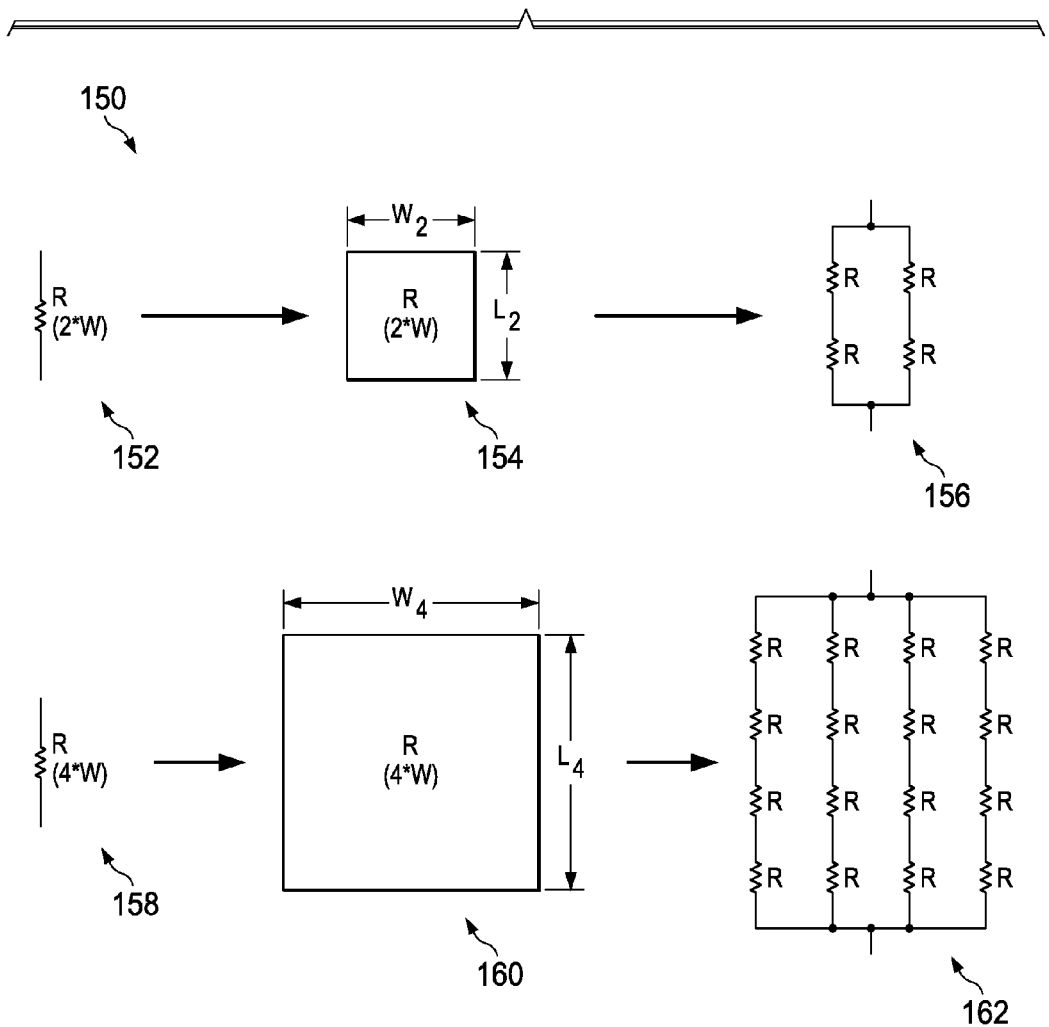
FIG. 4 illustrates an example of a diagram of resistors in accordance with an aspect of the invention.

FIG. 4 illustrates an example of a diagram 150 of resistors in accordance with an aspect of the invention. The diagram 150 includes a first resistor 152 that is demonstrated as having a resistance R, and which is also demonstrated in a first physical representation 154 and in a first schematic representation 156. The diagram 150 also includes a second resistor 158 that is demonstrated as also having a resistance R, and which is also demonstrated in a second physical representation 160 and in a second schematic representation 162.

The first resistor 152 is demonstrated as a resistor R, such as can be included in the R-2R resistive ladder 56, having a physical size of (2*W). As an example, the first resistor 152 can be one of the resistors R in the resistive rung 58 corresponding to the bit <6> of the digital input signal DIG_IN. Thus, the first physical representation 154 demonstrates the first resistor 152 as a poly-silicon resistor having a length of L2 and a width of W2. The first schematic representation 156 demonstrates a corresponding circuit arrangement of the first resistor 152, such as to be equivalent to two parallel paths that each includes two series-connected resistors R (i.e., each having the same resistance of the first resistor 152 itself). The resistors R in the first schematic representation 156 can each be equivalent to resistors of a physical size (1*W), such that they can be the minimum fabrication size for poly-silicon resistors.

The second resistor 158 has a greater physical size of (4*W) than the resistor 152. As an example, the second resistor 158 can be one of the resistors R in the resistive rung 58 corresponding to the bit <7> of the digital input signal DIG_IN. Thus, the second physical representation 160 demonstrates the second resistor 158 as a poly-silicon resistor having a length of L4 and a width of W4. The second schematic representation 162 demonstrates a corresponding circuit arrangement of the second resistor 158, such as to be equivalent to four parallel paths that each includes four series-connected resistors R (i.e., each having the same resistance of the second resistor 158 itself). The resistors R in the second schematic representation 162 can each be equivalent to resistors of a physical size (1*W), such that they can be the minimum fabrication size for poly-silicon resistors.

In the example of FIG. 4, the first and second resistors 152 and 158 can have the same resistance. However, as demonstrated by the first and second physical representations 154 and 160, as well as the first and second schematic representations 156 and 162, the second resistor 158 can be fabricated at a physical size that is approximately four times the size of the first resistor 152. Specifically, the second resistor 158 can be fabricated to have both a length and a width that is approximately twice that of the first resistor 156 to maintain the same resistance between the first and second resistors 152 and 158. While having the same resistance as the first resistor 152, the second resistor 158 can provide better resistance matching than the first resistor 152 based on having a larger physical size. It is to be understood that, although the first and second physical representations 154 and 160 of the respective first and second resistors 152 and 158 are demonstrated as square, the dimensions L2 and W2, as well as the dimensions L4 and W4, may not be equal. In addition, it is to be understood that resistors of other sizes, such as (16*W) and (8*W), can be configured in a substantially similar manner as the first and second resistors 152 and 158. Thus, a resistor of physical size (8*W) can be four times the size of the second resistor 158, and a resistor of physical size (16*W) can be sixteen times the size of the second resistor 158.

Referring back to the example of FIG. 2, based on the descending size-scaling of the resistors R of the resistive rungs 58, the R-2R DAC circuit 50 can be fabricated at a substantially smaller size than conventional R-2R DAC circuits while maintaining a required high resolution of the analog output voltage $V_{OUT}$. Specifically, because the contribution of DNL error due to the resistance mismatch of the resistors R is down-scaled from the MSB to the LSB, as described above with reference to Equation 12, the descending size-scaling of the resistors R in the resistive rungs 58 does not contribute additional DNL error, thus maintaining the resolution of the analog output voltage $V_{OUT}$. In addition, for the reasons described above with reference to the example of FIG. 4, the descending size-scaling of the resistors R can result in a significantly smaller IC area that includes the R-2R DAC circuit 50. As an example, the 10-bit R-2R DAC circuit 50 can be approximately 7.6 times smaller than a conventional R-2R DAC circuit with comparable resolution that implements a set of resistors of all the same size (e.g., 16*W). Furthermore, because the total resistor area of all of the resistors R is decreased, the integral non-linearity (INL) error that mainly results from stress, wafer, and/or temperature gradients in resistors that are separated on a wafer by large distances can also be substantially mitigated based on the closer proximity that the resistors R can be fabricated on a wafer.

It is to be understood that the R-2R DAC circuit 50 is not intended to be limited by the example of FIG. 2. As an example, the R-2R DAC circuit 50 can be configured with a resolution of more or less than 10 bits and can still implement descending size-scaling of the resistors R of the R-2R resistive ladder 56. As another example, the switching circuit 60 is not limited to the configuration demonstrated in the example of FIG. 2, but can be configured in any of a variety of ways to couple each of the resistive rungs 58 to the respective voltage rails 64 and 66. Those skilled in the art will understand and appreciate that the R-2R DAC circuit 50 can be configured in any of a variety of ways based on the description herein.

Figure 5:
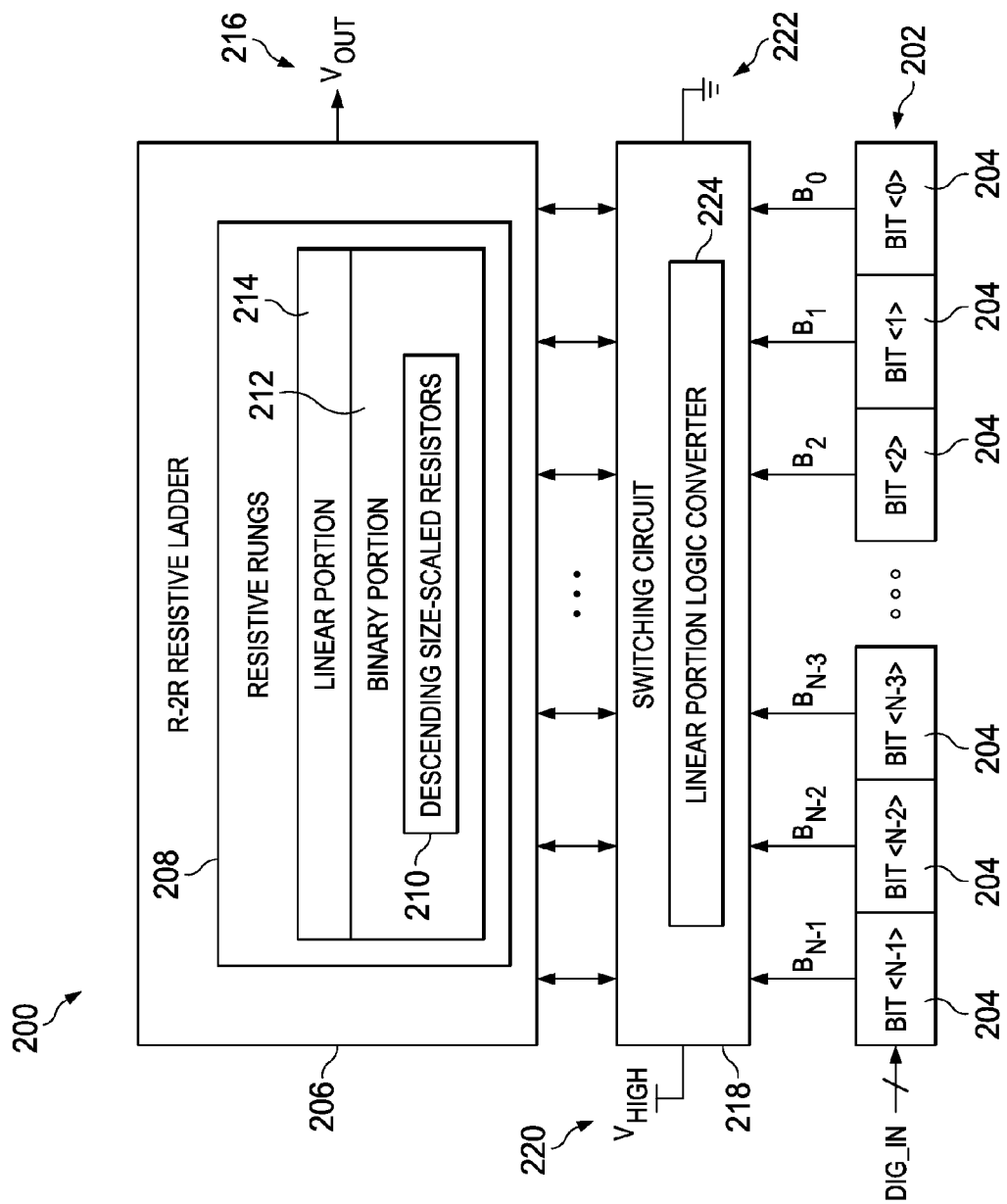
FIG. 5 illustrates another example of an R-2R DAC system in accordance with an aspect of the invention.

FIG. 5 illustrates another example of an R-2R DAC system 200 in accordance with an aspect of the invention. The R-2R DAC system 200 includes a digital register 202 that receives a digital input signal DIG_IN having N bits, where N is a positive integer. In the example of FIG. 5, the digital register 202 stores the N bits ranging from a most significant bit (MSB) of <N−1> to a least significant bit (LSB) of <0>. The digital register 202 can be a portion of a memory structure, such as any of a variety of random access memory (RAM) structures. Each of the cells 204 of the digital register 202 stores a binary value, demonstrated in the example of FIG. 5 as $B_{N-1}$ to $B_0$, for each bit of the digital input signal DIG_IN.

The R-2R DAC system 200 also includes an R-2R resistive ladder 206. The R-2R resistive ladder 206 comprises a plurality of resistive rungs 208 that comprises a plurality of resistors 210. As an example, each of the resistive rungs 208 can include a pair of series resistors 210 that extend between a switching node and an intermediate node, and a single resistor 210 can interconnect the intermediate nodes of adjacent pairs of the resistive rungs 208 of at least a portion of the R-2R resistive ladder 206. The resistors 210 can be poly-silicon resistors (e.g., thin-film resistors) having equal resistance.

In the example of FIG. 5, the resistive rungs 208 are separated into a binary portion 212 and a linear portion 214, both of which including a plurality of the resistors 210. As an example, the binary portion 212 can include a portion of the resistive rungs 208 in which switching nodes of adjacent resistive rungs 208 are interconnected by one of the resistors 210. At least a portion of the resistive rungs 208 in the linear portion 214 are coupled to an output 216 at which an analog output voltage $V_{OUT}$ is generated. In addition, the linear portion 214 can include a number of resistive rungs 208 that is greater than a corresponding number of MSBs of the digital input signal DIG_IN, as described herein.

The R-2R DAC system 200 further includes a switching circuit 218 that is configured to connect each of the resistive rungs 208 of the R-2R resistive ladder 206 to one of a high-voltage rail 220, demonstrated in the example of FIG. 5 as having a voltage $V_{HIGH}$, and a low-voltage rail 222, demonstrated in the example of FIG. 5 as ground. The switching of each of the resistive rungs 208 of the R-2R resistive ladder 206 can be in response to the digital bit signals $B_{N-1}$ through $B_0$. For example, the switching circuit 218 can include a plurality of drivers configured to buffer the digital bit signals into switching signals that control respective switches for each of the plurality of resistive rungs 208 of the R-2R resistive ladder 206. In addition, the switching circuit 218 includes a linear portion logic converter 224 that is configured to convert at least one of the bit signals corresponding to a respective at least one MSB into a plurality of switching signals that connect the resistive rungs 208 in the linear portion 214 to one of the high and low rails 220 and 222. The other switching signals are provided to control switches for connecting the resistive rungs 208 in the binary portion to either of the high or low voltage rails 220 and 222. Therefore, based on the coupling of the resistive rungs 208 to the high and/or low-voltage rails 220 and 222, the R-2R DAC circuit 200 generates the analog output voltage $V_{OUT}$ based on the digital value of the digital input signal DIG_IN.

As an example, all of the resistors 210 can have nominally the same resistance. However, similar to as described above in the example of FIG. 1, a portion of the resistors 210 are demonstrated in the example of FIG. 5 as being descending size-scaled resistors 210. As an example, the resistors 210 in each of the resistive rungs 208 of the linear portion 214 can have the same physical size. The physical size of the resistors 210 in the linear portion 214 can be a specific physical size for maintaining a sufficient DNL error of a predetermined fractional portion (e.g., approximately +/−0.5) of an analog magnitude of the LSB at an occurrence of a transition of the digital input signal DIG_IN, and which can be less than the physical size of the R-2R DAC circuit 50 in the example of FIG. 2 for a 10-bit digital input signal DIG_IN, as described herein. The resistors 210 in the resistive rungs 208 of the binary portion 212 can thus have a physical size that is descending size-scaled from the physical size of the resistive rungs 208 of the linear portion 214, such as by a power of two of other decreasing function, down to a minimum fabrication size for a poly-silicon resistor 210. As a result, the silicon area of the R-2R DAC system 200 can be substantially reduced relative to existing R-2R resistive ladders based on the significant decrease in the physical size of the resistors 210 resulting from the descending size-scaling.

Figure 6:
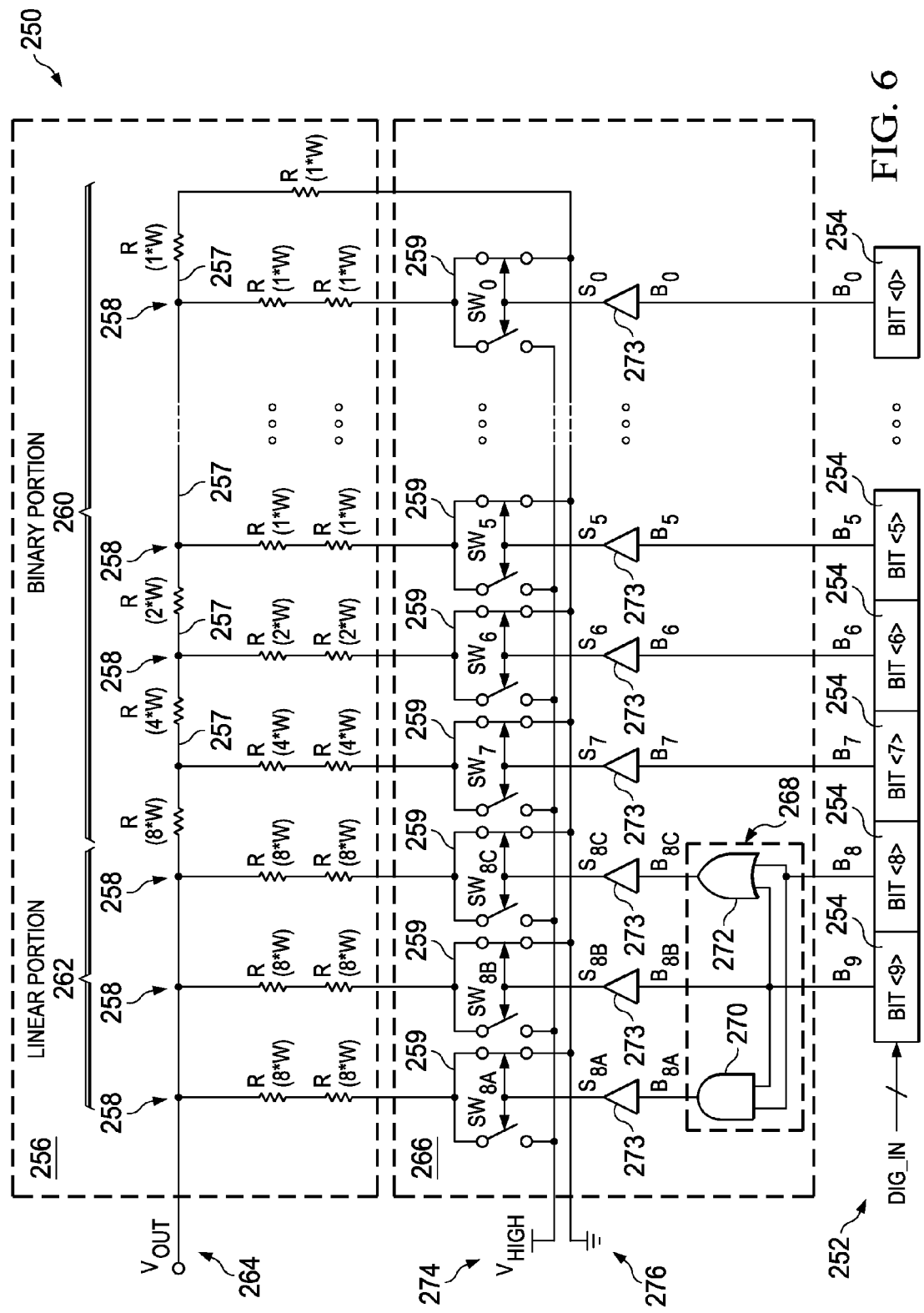
FIG. 6 illustrates another example of an R-2R DAC circuit in accordance with an aspect of the invention.

FIG. 6 illustrates an example of an R-2R DAC circuit 250 in accordance with an aspect of the invention. The R-2R DAC circuit 250 includes a digital register 252 that receives a 10-bit digital input signal DIG_IN. The digital register 252 can be a portion of a memory structure, such as any of a variety of RAM structures. Thus, each of the bits of the digital input signal DIG_IN is stored in a corresponding memory cell 254 of the digital register 252. In the example of FIG. 6, the memory cells 254 of the digital register 252 are arranged from an MSB of <9> to an LSB of <0>. Thus, each of the memory cells 254 stores a value of a digital bit, demonstrated in the example of FIG. 6 as $B_9$ to $B_0$, that corresponds to the binary value of each of the respective ten bits of the digital input signal DIG_IN.

The R-2R DAC circuit 250 also includes an R-2R resistive ladder 256. The R-2R resistive ladder 256 comprises a plurality of resistive rungs 258 that comprises a plurality of resistors, demonstrated in the example of FIG. 6 as "R". As an example, the resistors R can be poly-silicon resistors (e.g., thin-film resistors) each having approximately equal resistance. In the example of FIG. 6, the R-2R resistive ladder 256 includes a binary portion 260 and a linear portion 262. The resistive rungs 258 in the binary portion 260 are each separated at an intermediate node 257 by a single resistor R, and each of the resistive rungs 258 includes a series pair of resistors R between the intermediate node 257 and a switching node 259. The resistive rungs 258 in the linear portion 262 also each include a series pair of resistors R. However, each of the resistive rungs 258 in the linear portion 262 interconnects a respective switching node 259 and a DAC output 264.

The R-2R DAC circuit 250 further includes a switching circuit 266. The switching circuit 266 includes a linear portion logic converter 268 that is configured to convert the bit signals $B_9$ and $B_8$ corresponding to the two MSBs bit <9> and bit <8>, in binary code format, to three bit signals $B_{8A}$, $B_{8B}$, and $B_{8C}$ in thermometer code format Specifically, the linear portion logic converter 268 includes an AND-gate 270 and an OR-gate 272 that each receives the bit signals $B_9$ and $B_8$ as inputs. In response to the bit signals $B_9$ and $B_8$, the AND-gate 270 generates the bit signal $B_{8A}$ and the OR-gate 272 generates the bit signal $B_{8C}$. The bit signal $B_{8B}$ is demonstrated in the example of FIG. 6 as being equivalent to the bit signal $B_9$.

The switching circuit 266 also includes a plurality of drivers 273 that are configured to generate respective switching signals $S_{8A}$, $S_{8B}$, $S_{8C}$, and $S_7$ through $S_0$. The switching signals $S_{8A}$, $S_{8B}$, $S_{8C}$, and $S_7$ through $S_0$ are provided to respective sets of switches $SW_{8A}$, $SW_{8B}$, $SW_{8C}$, and $SW_7$ through $SW_0$. In the example of FIG. 6, the switches $SW_{8A}$, $SW_{8B}$, $SW_{8C}$, and $SW_7$ through $SW_0$ are configured to connect each of the resistive rungs 258 of the R-2R resistive ladder 256 to one of a high-voltage rail 274, demonstrated in the example of FIG. 6 as having a voltage $V_{HIGH}$, or a low-voltage rail 276, demonstrated in the example of FIG. 6 as ground. For example, a logic-high binary value of the switching signals $S_{8A}$, $S_{8B}$, $S_{8C}$, and $S_7$ through $S_0$ activates the respective switches $SW_{8A}$, $SW_{8B}$, $SW_{8C}$, and $SW_7$ through $SW_0$ to couple the respective resistive rungs 258 to the high-voltage rail 274. Conversely, a logic-low binary value of the switching signals $S_{8A}$, $S_{8B}$, $S_{8C}$, and $S_7$ through $S_0$ activates the respective switches $SW_{8A}$, $SW_{8B}$, $SW_{8C}$, and $SW_7$ through $SW_0$ to couple the respective resistive rungs 258 to the low-voltage rail 276. Therefore, based on the coupling of the resistive rungs 258 to the high or low-voltage rails 274 and 276, the R-2R DAC circuit 250 generates the analog output voltage $V_{OUT}$ based on the digital value of the digital input signal DIG_IN.

Similar to as described above, all of the resistors R can be fabricated to have nominally the same resistance, but circuit fabrication process and temperature variations can result in slight variations in the resistance matching of each of the resistors R. The variation in matching of the resistors R can thus result in DNL error in the magnitude of the analog output voltage $V_{OUT}$, such as for a given transition from one digital value to another. However, based on the configuration of the linear portion 262 of the R-2R DAC circuit 250, the binary transition of the binary value of the MSB being switched mutually exclusive relative to the other bits of the digital input signal DIG_IN can contribute less DNL error than the configuration described above in the example of FIGS. 2 and 3. As a result, the physical size of the resistors R in the linear portion 262 can be fabricated to be smaller than the resistors R of the resistive rung 58 corresponding to the MSB of the R-2R DAC circuit 50 in the example of FIG. 2.

Figure 7:
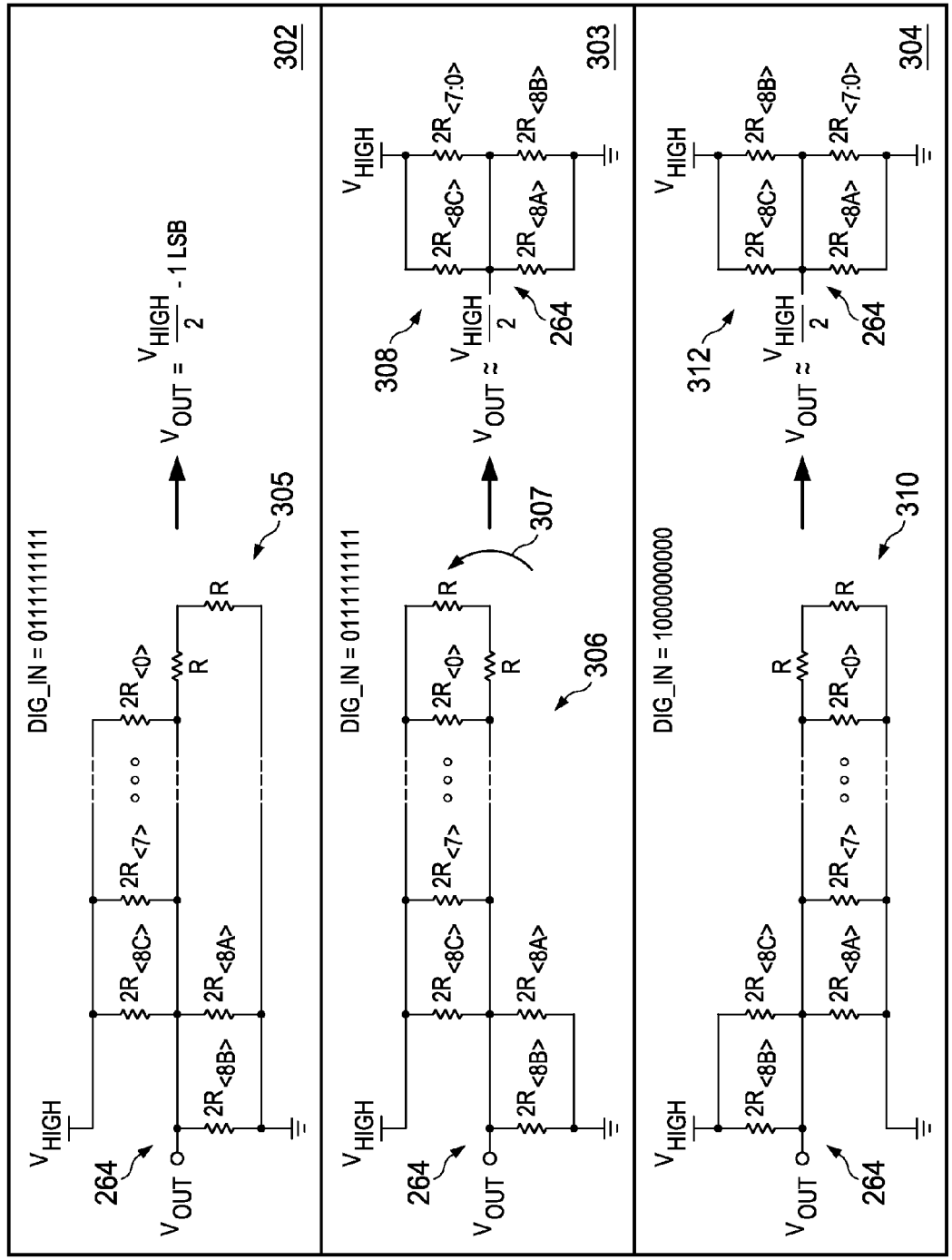
FIG. 7 illustrates an example of a MSB transition of the R-2R DAC circuit of the example of FIG. 6 in accordance with an aspect of the invention.

FIG. 7 illustrates an example of a diagram 300 demonstrating an MSB transition (i.e., a <9> transition) of the R-2R DAC circuit 250 of the example of FIG. 6 in accordance with an aspect of the invention. Thus, reference is to be made to the example of FIG. 6 in the following description of FIG. 7.

The diagram 300 demonstrates a first schematic representation 302 and a second schematic representation 303 of the R-2R resistive ladder 256, each having a first logic state that corresponds to the digital input signal DIG_IN='0111111111'. The diagram 300 also demonstrates a third schematic representation 304 of the R-2R resistive ladder 256 having a second logic state that corresponds to a digital value of the digital input signal DIG_IN='1000000000'. Therefore, the diagram 300 demonstrates a transition of the digital input signal DIG_IN as a change from the digital value '0111111111' to the digital value '1000000000'.

In the example of FIG. 7, the first schematic representation 302 demonstrates a circuit 305 in which the R-2R resistive ladder 256 is configured such that the resistive rungs 258 corresponding to the switching signals $S_{8A}$ and $S_{8B}$, as well as the right-most resistive rung, are coupled to ground and the remaining resistive rungs 258 are coupled to the voltage $V_{HIGH}$. The output voltage $V_{OUT\_305}$ of the circuit 305 is thus approximately equal to $(V_{HIGH}/2)-1$ LSB.

The second schematic representation 303 demonstrates a circuit 306 that is modified from circuit 305. Specifically, the circuit 306 is formed by disconnecting the resistive rung at the right-most position of the circuit 305 from ground and connecting it to the voltage $V_{HIGH}$, as indicated by the arrow 307. It is to be understood that the switching of the resistive rung from ground to the voltage $V_{HIGH}$ is a theoretical manipulation of the circuit 305 for purposes of measuring DNL error, as demonstrated in greater detail below. However, such a switching can be implemented by actual circuit devices, such as a dummy switch that always couples the resistive rung to ground during normal operation of the R-2R resistive ladder 256.

As a result of the switching of the right-most resistive rung from ground to the voltage $V_{HIGH}$, the output voltage $V_{OUT}$ is increased by a voltage that is one LSB greater than the circuit 305. The circuit 306 is demonstrated as a simplified circuit 308, in which the resistors 2R corresponding to the switching signals $S_{8A}$ and $S_{8B}$ (i.e., $2R_{<8A>}$ and $2R_{<8B>}$) are demonstrated in parallel between the output 264 and ground. The simplified circuit 308 also demonstrates the resistors $2R_{<8C>}$ corresponding to the switching signal $S_{8C}$ in parallel with the lumped resistors $2R_{<7:0>}$, which is equivalent to the resistive rungs 258 of the switching signals $S_7$ through $S_0$ corresponding to the bits $B_7$ through $B_0$, between the output 264 and the voltage $V_{HIGH}$. Because the magnitude of the output voltage $V_{OUT}$ of the circuit 306 is increased by a voltage that is one LSB greater than the circuit 305, the output voltage $V_{OUT}$ would be equal to $V_{HIGH}/2$ if the resistors $2R_{<7:0>}$, $2R_{<8A>}$, $2R_{<8B>}$, and $2R_{<8C>}$ were perfectly matched. However, the output voltage $V_{OUT\_306}$ of the circuit 306 can be properly expressed as follows:

$$V_{OUT\_306} = \frac{2R_{(8A)} // 2R_{(7:0)}}{(2R_{(8A)} // 2R_{(7:0)}) + (2R_{(8B)} // 2R_{(8C)})} * V_{HIGH} \quad \text{Equation 13}$$

The third schematic representation 304 demonstrates a circuit 310 in which the R-2R resistive ladder 256 is configured such that the resistive rungs 258 corresponding to the switching signals $S_{8A}$ and $S_{8C}$ are coupled to the voltage $V_{HIGH}$ and the remaining resistive rungs 258, including the resistive rung at the right-most position of the circuit 310, are coupled to ground. The circuit 310 is demonstrated as a simplified circuit 312, in which the resistors 2R corresponding to the switching signals $S_{8B}$ and $S_{8C}$ (i.e., $2R_{<8B>}$ and $2R_{<8C>}$) are demonstrated in parallel between the output 264 and the voltage $V_{HIGH}$. The simplified circuit 312 also demonstrates the resistors $2R_{<8A>}$ corresponding to the switching signal $S_{8A}$ in parallel with the lumped resistors $2R_{<7:0>}$ equivalent to the resistive rungs 258 of the switching signals $S_7$ through $S_0$ between the output 264 and ground. Therefore, the analog output voltage $V_{OUT}$ would likewise have a magnitude of $V_{HIGH}/2$ if the resistors $2R_{<7:0>}$, $2R_{<8A>}$, $2R_{<8B>}$, and $2R_{<8C>}$ were perfectly matched. However, the output voltage $V_{OUT\_310}$ of the circuit 310 can be expressed as follows:

$$V_{OUT\_110} = \frac{2R_{(8A)} // 2R_{(8C)}}{(2R_{(8A)} // 2R_{(8C)}) + (2R_{(8B)} // 2R_{(7:0)})} * V_{HIGH} \quad \text{Equation 14}$$

Accordingly, as demonstrated in the example of FIG. 7, upon a transition of the digital input signal DIG_IN from '0111111111' to '1000000000', the resistors $2R_{<8B>}$ and the lumped resistors $2R_{<7:0>}$ swap their connections between ground and the voltage $V_{HIGH}$. However, the $2R_{<8A>}$ and $2R_{<8C>}$ remain coupled to ground and to the voltage $V_{HIGH}$, respectively, before and after the transition. It is to be understood that the analog output voltage $V_{OUT}$ after the transition (i.e., DIG_IN='1000000000' as demonstrated in the third schematic representation 304) is greater than the analog output voltage $V_{OUT}$ before the transition (i.e., DIG_IN='0111111111' demonstrated in the first schematic representation 302) by an analog magnitude of exactly 1 LSB if all the resistors were perfectly matched. However, the actual step of the transition may deviate from the exact 1 LSB step based on a mismatch between the resistors. The error between the actual step and the ideal step is the DNL of the <9> transition. Specifically, the DNL error of the transition from the code DIG_IN='0111111111' to the code DIG_IN='1000000000' demonstrated in the example of FIG. 7 can be calculated as follows:

$$DNL_{<9>transition} = V_{OUT\_AFTER} - V_{OUT\_BEFORE} \quad \text{Equation 15}$$

Equation 15 can be expressed as the actual step amplitude when the input code DIG_IN transitions from '0111111111' to '1000000000' minus the ideal step amplitude when the input code DIG_IN transitions from '0111111111' to '1000000000'. Therefore, Equation 15 can be rewritten as follows:

$$= (V_{OUT\_310} - V_{OUT\_305}) + 1 LSB \quad \text{Equation 16}$$

$$= V_{OUT\_310} - (V_{OUT\_305} + 1 LSB) \quad \text{Equation 17}$$

$$= V_{OUT\_310} - V_{OUT\_306} \quad \text{Equation 18}$$

$$= \frac{2R_{(8A)} // 2R_{(7:0)}}{(2R_{(8A)} // 2R_{(7:0)}) + (2R_{(8B)} // 2R_{(8C)})} * V_{HIGH} - \frac{2R_{(8A)} // 2R_{(8C)}}{(2R_{(8A)} // 2R_{(8C)}) + (2R_{(8B)} // 2R_{(7:0)})} * V_{HIGH} \quad \text{Equation 19}$$

$$\approx \frac{1}{4}\left(\frac{2R_{(7:0)}}{2R_{(8C)}} - 1\right) * V_{HIGH} \quad \text{Equation 20}$$

$$= \frac{1}{4}\Delta(2R_{(8C)}, 2R_{(7:0)}) * V_{HIGH} \quad \text{Equation 21}$$

The DNL error demonstrated by the above Equations is caused because resistor $2R_{<8B>}$ and the lumped resistor $2R_{<7:0>}$ swap their connections between the voltage $V_{HIGH}$ and ground, and each of the resistor $2R_{<8B>}$ and the lumped resistor $2R_{<7:0>}$ represent $V_{HIGH}/2$ at the DAC output. In other words, switching the resistor $2R_{<8B>}$ and the lumped resistor $2R_{<8:0>}$ between the voltage $V_{HIGH}$ and ground results in a change of magnitude of the output voltage $V^{OUT}$ at the DAC output. In Equation 21, the term "$\Delta(2R_{<8B>}, 2R_{<7:0>})$" is representative of a normalized resistance mismatch error between the resistors $2R_{<8B>}$ and $2R_{<7:0>}$ which can be modeled with a standard deviation based on Equation 11 above.

Based on a comparison of Equations 10 and 21, it is determined that the transition demonstrated in the example of FIG. 7 can result in a lesser contribution to DNL error than the same transition demonstrated in the example of FIG. 3 for the R-2R DAC circuit 50. Specifically, comparing Equation 21 to Equation 10, it is demonstrated that the transition in the example of FIG. 7 contributes about half of the DNL error that the same transition demonstrated in the example of FIG. 3 contributes. The reason for the decreased DNL error is because each of the resistive rungs $2R_{<8B>}$ and $2R_{<7:0>}$ represents a magnitude of $V_{HIGH}/4$ at the DAC output, which is half the amplitude represented by each of the resistive rungs $2R_{<9>}$ and $2R_{<8:0>}$ (i.e., $V_{HIGH}/2$) at the DAC output in the example of FIG. 3. Therefore, the mismatch between the resistive rungs $2R_{<8B>}$ and $2R_{<7:0>}$ in the R-2R resistive ladder 250 in the example of FIGS. 6 and 7 contributes less error to DNL than the mismatch between the resistive rungs $2R_{<9>}$ and $2R_{<8:0>}$ in the example of FIGS. 2 and 3. As a result, referring back to the example of FIG. 6, the physical size of the resistors R in the resistive rungs 258 of the linear portion 262 can be fabricated to be approximately half the size of the largest resistors R of the R-2R DAC circuit 50 in the example of FIG. 2. While exhibiting comparable performance, each of the resistors R in the linear portion 262 are demonstrated in the example of FIG. 6 as having a physical size of (8*W) while the resistors in the resistive run 58 in the example of FIG. 2 have a physical size of (16*W). For the 10-bit R-2R DAC circuit 250 in the example of FIG. 6, the physical size (8*W) of the resistors R in the linear portion 262 can thus correspond to the a specific physical size sufficient to maintain the DNL error of within a predetermined fractional portion (e.g., approximately +/−0.5) of an analog magnitude of the LSB at the transition demonstrated in the example of FIG. 7, such as having a standard deviation modeled by Equation 5.

The resistors R in the first resistive rung 258 in the binary portion 260 (i.e., corresponding to the switching signal $S_7$), as well as the resistor R that interconnects to the next resistive rung 258, have a physical size (4*W). Thus, the resistors R in the binary portion 260 are descending size-scaled by a power of two down to the minimum fabrication size for a polysilicon resistor of (1*W) at the resistive rung 258 corresponding to bit <5>, at which the remainder of the resistors R all have a minimum physical size of (1*W).

Based on the smaller physical size of the resistors R in the linear portion 262 relative to the largest resistors R in the R-2R DAC circuit 50 in the example of FIG. 2, the R-2R DAC circuit 250 in the example of FIG. 6 can be fabricated with an area that is approximately half the area of the R-2R DAC circuit 50. In addition, for the reasons described above, despite the smaller size of the resistors R in the linear portion 262 of the R-2R DAC circuit 250, the R-2R DAC circuit 250 can maintain the resolution of the analog output voltage $V_{OUT}$ based on substantially mitigating DNL error at bit transitions of the digital input signal DIG_IN. Furthermore, because the total resistor area of all of the resistors R is decreased, INL error can likewise be mitigated.

It is to be understood that the R-2R DAC circuit 250 is not intended to be limited by the example of FIG. 6. As an example, the R-2R DAC circuit 250 can be configured with a resolution of more or less than 10 bits and can still implement descending size-scaling of the resistors R of the R-2R resistive ladder 256. As another example, the switching circuit 266 is not limited to the configuration demonstrated in the example of FIG. 6, but can be configured in any of a variety of ways to couple each of the resistive rungs 258 to the high and low-power voltage rails 274 and 276. For example, the linear portion logic converter 268 can implement a variety of logic designs to generate the respective bit signals $B_{8A}$, $B_{8B}$, and $B_{8C}$ in response to the bit signals $B_9$ and $B_8$. Therefore, the R-2R DAC circuit 250 can be configured in any of a variety of ways.

Figure 8:
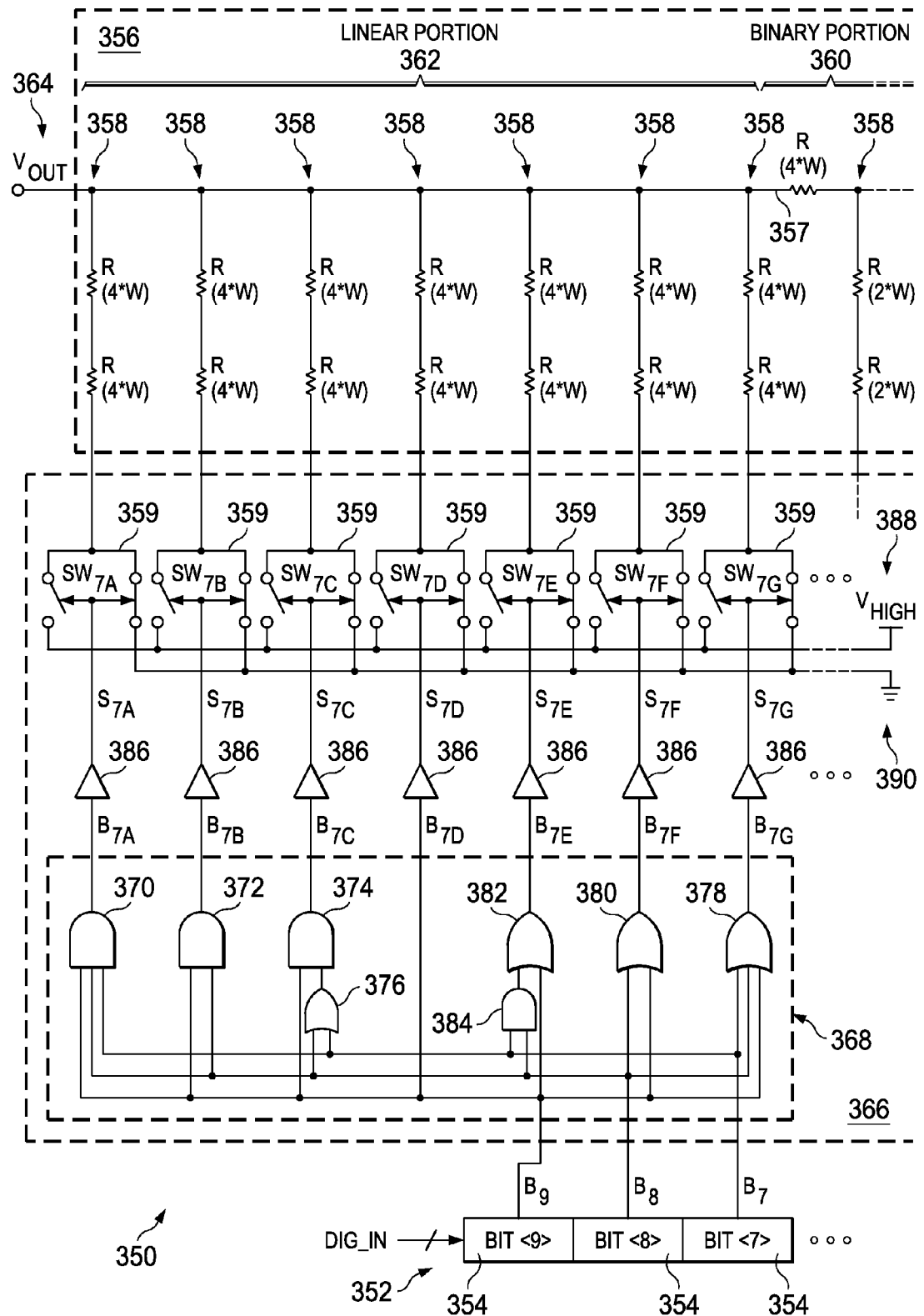
FIG. 8 illustrates yet another example of an R-2R DAC circuit in accordance with an aspect of the invention.

FIG. 8 illustrates an example of an R-2R DAC circuit 350 in accordance with an aspect of the invention. The R-2R DAC circuit 350 includes a digital register 352 that receives a 10-bit digital input signal DIG_IN. Each of the bits of the digital input signal DIG_IN is stored in a corresponding memory cell 354 of the digital register 352. In the example of FIG. 8, the memory cells 354 of the digital register 352 are arranged from an MSB of <9> to an LSB of <0> of the digital signal DIG_IN. Thus, each of the memory cells 354 stores a digital bit, demonstrated in the example of FIG. 8 as $B_9$ to $B_0$, that corresponds to the binary value of each of the respective ten bits of the digital input signal DIG_IN.

The R-2R DAC circuit 350 also includes an R-2R resistive ladder 356. The R-2R resistive ladder 356 comprises a plurality of resistive rungs 358 that comprises a plurality of resistors, demonstrated in the example of FIG. 8 as "R". As an example, the resistors R can be poly-silicon resistors (e.g., thin-film resistors) having approximately equal resistance. In the example of FIG. 8, the R-2R resistive ladder 356 includes a binary portion 360 and a linear portion 362. The resistive rungs 358 in the binary portion 360 are each separated at an intermediate node 357 by a single resistor R, and each of the resistive rungs 358 includes a series pair of resistors R between the intermediate node 357 and a switching node 359. The resistive rungs 358 in the linear portion 362 also each include a series pair of resistors R. Similar to as described above in the example of FIG. 6, each of the resistive rungs 358 in the linear portion 362 interconnects a respective switching node 359 and a DAC output 364.

The R-2R DAC circuit 350 further includes a switching circuit 366. The switching circuit 366 includes a linear portion logic converter 368 that is configured to convert the bit signals $B_9$ and $B_8$ respectively corresponding to the three MSBs bit <9>, bit <8>, and bit <7> in binary code format, to seven bit signals $B_{7A}$ through $B_{7G}$ in thermometer code format. For example, the linear portion logic converter 368 includes a first AND-gate 370 that receives all three of the bit signals $B_9$ through $B_7$ and generates the bit signal $B_{7A}$, a second AND-gate 372 that receives the bit signals $B_9$ and $B_8$ and generates the bit signal $B_{7B}$, and a third AND-gate 374 that receives the bit signal $B_9$ and an output of an interposing OR-gate 376 and generates the bit signal $B_{7C}$. The interposing OR-gate 376 receives the bit signals $B_8$ and $B_7$ to generate the input to the third AND-gate 374. The linear portion logic converter 368 also includes a first OR-gate 378 that receives all three of the bit signals $B_9$ through $B_7$ and generates the bit signal $B_{7G}$, a second OR-gate 380 that receives the bit signals $B_9$ and $B_8$ and generates the bit signal $B_{7F}$, and a third OR-gate 382 that receives the bit signal $B_9$ and an output of an interposing AND-gate 384 and generates the bit signal $B_{7E}$. The interposing AND-gate 384 receives the bit signals $B_8$ and $B_7$ to generate the input to the third OR-gate 382. The bit signal $B_{7D}$ is demonstrated in the example of FIG. 8 as being equivalent to the bit signal $B_9$.

The switching circuit 366 also includes a plurality of drivers 386 that are configured to generate respective switching signals $S_{7A}$ through $S_{7G}$ and $S_6$ through $S_0$ based on the digital bit values $B_{7A}$ through $B_{7G}$ and $B_6$ through $B_0$. The switching signals $S_{7A}$ through $S_{7G}$ and $S_6$ through $S_0$ are provided to respective sets of switches $SW_{7A}$ through $SW_{7G}$ and $SW_6$ through $SW_0$. In the example of FIG. 8, the switches $SW_{7A}$ through $SW_{7G}$ and $SW_6$ through $SW_0$ are configured to connect each of the resistive rungs 358 of the R-2R resistive ladder 356 to one of a high-voltage rail 388, demonstrated in the example of FIG. 8 as having a voltage $V_{HIGH}$, and a low-voltage rail 390, demonstrated in the example of FIG. 8 as ground. For example, a logic-high binary value of the switching signals $S_{7A}$ through $S_{7G}$ and $S_6$ through $S_0$ activates the respective switches $SW_{7A}$ through $SW_{7G}$ and $SW_6$ through $SW_0$ to couple the switching nodes 359 of the respective resistive rungs 358 to the high-voltage rail 388. Conversely, a logic-low binary value of the switching signals $S_{7A}$ through $S_{7G}$ and $S_6$ through $S_0$ activates the respective switches $SW_{7A}$ through $SW_{7G}$ and $SW_6$ through $SW_0$ to couple the switching nodes 359 of the respective resistive rungs 358 to the low-voltage rail 390. Therefore, based on the coupling of the resistive rungs 358 to the high or low-voltage rails 374 and 376, the R-2R DAC circuit 350 generates the analog output voltage $V_{OUT}$ based on the digital value of the digital input signal DIG_IN.

Similar to as described above, regarding the R-2R DAC circuit 250 in the example of FIG. 6, based on the configuration of the linear portion 362 of the R-2R DAC circuit 350, the binary transition of the binary value of the MSB being switched opposite the other bits of the digital input signal DIG_IN can contribute less DNL error than the configurations described above in the example of FIGS. 2 and 3. As a result, the physical size of the resistors R in the linear portion 362 can be fabricated to be smaller than the resistors R of the resistive rung 58 corresponding to the MSB of the R-2R DAC circuit 50 in the example of FIG. 2 and smaller than the resistors R of the resistive rungs 258 in the linear portion 262 of the R-2R DAC circuit 250 in the example of FIG. 6.

Figure 9:
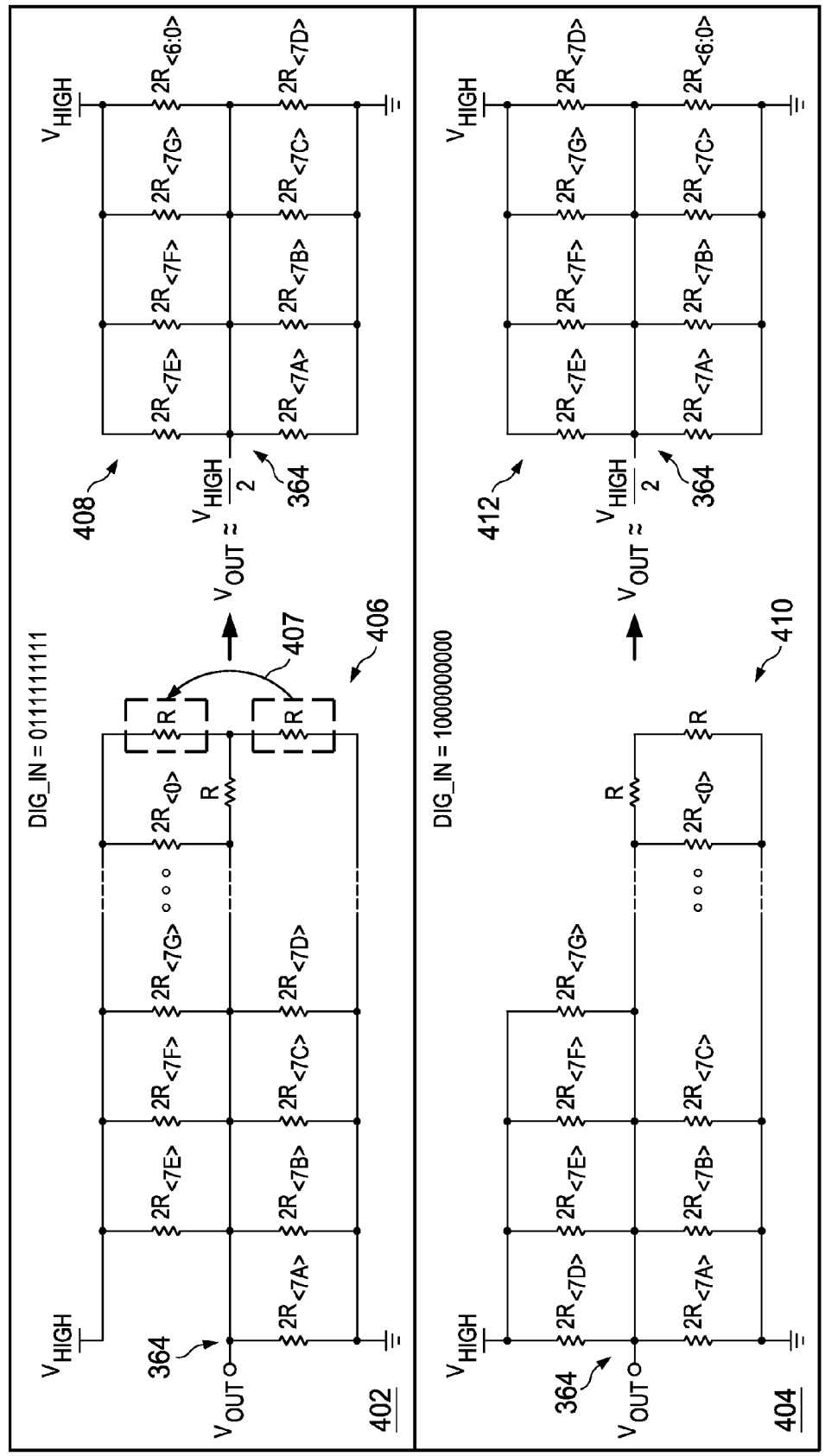
FIG. 9 illustrates an example of a MSB transition of the R-2R DAC circuit of the example of FIG. 8 in accordance with an aspect of the invention.

FIG. 9 illustrates an example of a diagram 400 demonstrating an LSB transition of the R-2R DAC circuit 350 of the example of FIG. 8 in accordance with an aspect of the invention. Thus, because the diagram 400 demonstrates the R-2R DAC circuit 350, reference is to be made to the example of FIG. 8 in the following description of FIG. 9.

The diagram 400 demonstrates a first schematic representation 402 of the R-2R resistive ladder 356 corresponding to a digital value of the digital input signal DIG_IN of '0111111111'. The diagram 400 also demonstrates a second schematic representation 404 of the R-2R resistive ladder 356 corresponding to a digital value of the digital input signal DIG_IN of '1000000000'. Therefore, the diagram 400 demonstrates a transition of the digital input signal DIG_IN between the digital value '0111111111' and the digital value '1000000000' for the R-2R DAC circuit 350 in the example of FIG. 8.

In the example of FIG. 9, the first schematic representation 402 demonstrates a circuit 406 in which the R-2R resistive ladder 356 is configured such that the resistive rungs 358 corresponding to the switching signals $S_{7A}$, $S_{7B}$, $S_{7C}$, and $S_{7D}$ are coupled to ground and the remaining resistive rungs 358 are coupled to the voltage $V_{HIGH}$. The circuit 406 is demonstrated as a simplified circuit 408, in which the resistors 2R corresponding to the switching signals $S_{7A}$, $S_{7B}$, $S_{7C}$, and $S_{7D}$ (i.e., $2R_{<7A>}$, $2R_{<7B>}$, $2R_{<7C>}$, and $2R_{<7D>}$, respectively) are demonstrated in parallel between the output 364 and ground. The simplified circuit 408 also demonstrates the resistors 2R corresponding to the switching signals $S_{7E}$, $S_{7F}$, and $S_{7G}$ (i.e., $2R_{<7E>}$, $2R_{<7F>}$, and $2R_{<7G>}$, respectively) in parallel with the lumped resistors $2R_{<6:0>}$ corresponding to the resistive rungs 358 of the switching signals $S_6$ through $S_0$ between the output 364 and the voltage $V_{HIGH}$. In addition, the first schematic representation 402 demonstrates the coupling of the right-most resistive rung, such as via a dummy switch, to increment the magnitude of the circuit 410 by 1 LSB, as demonstrated by the arrow 407, in a manner similar to as described above in the examples of FIGS. 3 and 9. Therefore, the analog output voltage $V_{OUT}$ of the simplified circuit 408 would have a magnitude of $V_{HIGH}/2$ if all of the resistors were perfectly matched.

The second schematic representation 404 demonstrates a circuit 410 in which the R-2R resistive ladder 356 is configured such that the resistive rungs 358 corresponding to the switching signals $S_{7D}$, $S_{7E}$, $S_{7F}$, and $S_{7G}$ are coupled to the voltage $V_{HIGH}$ and the remaining resistive rungs 358 are coupled to ground. The circuit 410 is demonstrated as a simplified circuit 412, in which the resistors 2R corresponding to the switching signals $S_{7D}$, $S_{7E}$, $S_{7F}$, and $S_{7G}$ (i.e., $2R_{<7D>}$, $2R_{<7E>}$, $2R_{<7F>}$, and $2R_{<7G>}$, respectively) are demonstrated in parallel between the output 364 and the voltage $V_{HIGH}$. The simplified circuit 412 also demonstrates the resistors 2R corresponding to the switching signals $S_{7A}$, $S_{7B}$, and $S_{7C}$ (i.e., $2R_{<7A>}$, $2R_{<7B>}$, and $2R_{<7C>}$, respectively) in parallel with the resistors $2R_{<6:0>}$ corresponding to the simplified parallel coupling of the resistive rungs 358 of the switching signals $S_6$ through $S_0$ between the output 364 and ground. Therefore, the analog output voltage $V_{OUT}$ of the simplified circuit 412 would have a magnitude of $V_{HIGH}/2$ if all of the resistors were perfectly matched.

Accordingly, as demonstrated in the example of FIG. 9, upon a transition of the digital input signal DIG_IN from 0111111111 to 1000000000, the resistors $2R_{<7D>}$ and the remaining resistors $2R_{<6:0>}$ swap their connections between ground and the voltage $V_{HIGH}$. However, the resistors $2R_{<7A>}$ through $2R_{<7C>}$ and the resistors $2R_{<7E>}$ through $2R_{<7G>}$ remain coupled to ground and to the voltage $V_{HIGH}$, respectively, before and after the transition. The DNL error of the transition demonstrated in the example of FIG. 9 can be calculated in a similar manner to as demonstrated above in Equations 5 through 10 and Equations 15 through 21. Therefore, it is determined that the transition demonstrated in the example of FIG. 9 contributes less DNL error than the same transitions demonstrated in the examples of FIGS. 3 and 7 for the R-2R DAC circuits 50 and 250, respectively. Similar to the comparison of Equations 21 and 10, the transition in the example of FIG. 9 contributes about half of the DNL error that the same transition demonstrated in the configuration in the example of FIG. 7 contributes and only about one quarter of the DNL error that the same transition demonstrated in the configuration of the example of FIG. 3 contributes. As a further example, referring back to the example of FIG. 8, the physical size of the resistors R in the resistive rungs 358 of the linear portion 362 can be fabricated to be about one quarter the area of the largest resistors R of the R-2R DAC circuit 250 in the example of FIG. 6. For instance, each of the resistors R in the linear portion 362 are demonstrated in the example of FIG. 8 as having a physical size of (4*W), whereas the resistors R in the linear portion 262 of the R-2R DAC system 250 in the example of FIG. 6 have a physical size of (8*W). For the 10-bit R-2R DAC circuit 350 in the example of FIG. 8, the physical size (4*W) of the resistors R in the linear portion 362 can thus be a specific physical size sufficient to maintain the DNL error of within the predetermined fractional portion (e.g., approximately +/−0.5) of an analog magnitude of the LSB at the transition demonstrated in the example of FIG. 9.

The resistors R in the first resistive rung 358 in the binary portion 360 (i.e., corresponding to the switching signal $S_6$), as well as the interconnecting resistor R to the next resistive rung 358, have a physical size (2*W). Thus, the resistors R in the binary portion 360 are descending size-scaled by a power of two down to a minimum fabrication size for a poly-silicon resistor of (1*W) at the resistive rung 58 corresponding to bit <5>. The remainder of the resistors R can all have a physical size of (1*W).

Based on the smaller physical size of the resistors R in the linear portion 362 of the resistive ladder 356 relative to the largest resistors R in the R-2R DAC circuit 50 in the example of FIG. 2, the R-2R DAC circuit 350 in the example of FIG. 8 can be fabricated at a size that is approximately half the size of the R-2R DAC circuit 250 of the example of FIG. 6 and approximately one quarter the size of the R-2R DAC circuit 50 of the example of FIG. 2. In addition, for the reasons described above, despite the smaller size of the resistors R in the linear portion 362 of the R-2R DAC circuit 350, the R-2R DAC circuit 350 can maintain the resolution of the analog output voltage $V_{OUT}$ due to the reduced DNL error at transitions of the digital input signal DIG_IN. Furthermore, because the total resistor area of all of the resistors R is decreased, error due to INL can likewise be mitigated.

It is to be understood that the R-2R DAC circuit 350 is not intended to be limited by the example of FIG. 8. As an example, the R-2R DAC circuit 350 can be configured with a resolution of more or less than 10 bits and can still implement descending size-scaling of the resistors R of the R-2R resistive ladder 356. As another example, the switching circuit 366 is not limited to the configuration demonstrated in the example of FIG. 8, but can be configured in any of a variety of ways to couple each of the resistive rungs 358 to the high and low-power voltage rails 374 and 376. For example, the linear portion logic converter 368 can implement a variety of logic designs to generate the respective bit signals $B_{7A}$ through $B_{7G}$ in response to the bit signals $B_9$, $B_8$, and $B_7$. Furthermore, based on the configurations of the R-2R DAC circuits 250 and 350 in the examples of FIGS. 6 and 8, respectively, it can be ascertained that further physical size reduction of the largest resistors R is possible based on increasing the number of MSBs that are associated with the linear portion of the respective R-2R resistive ladder.

Figure 10:
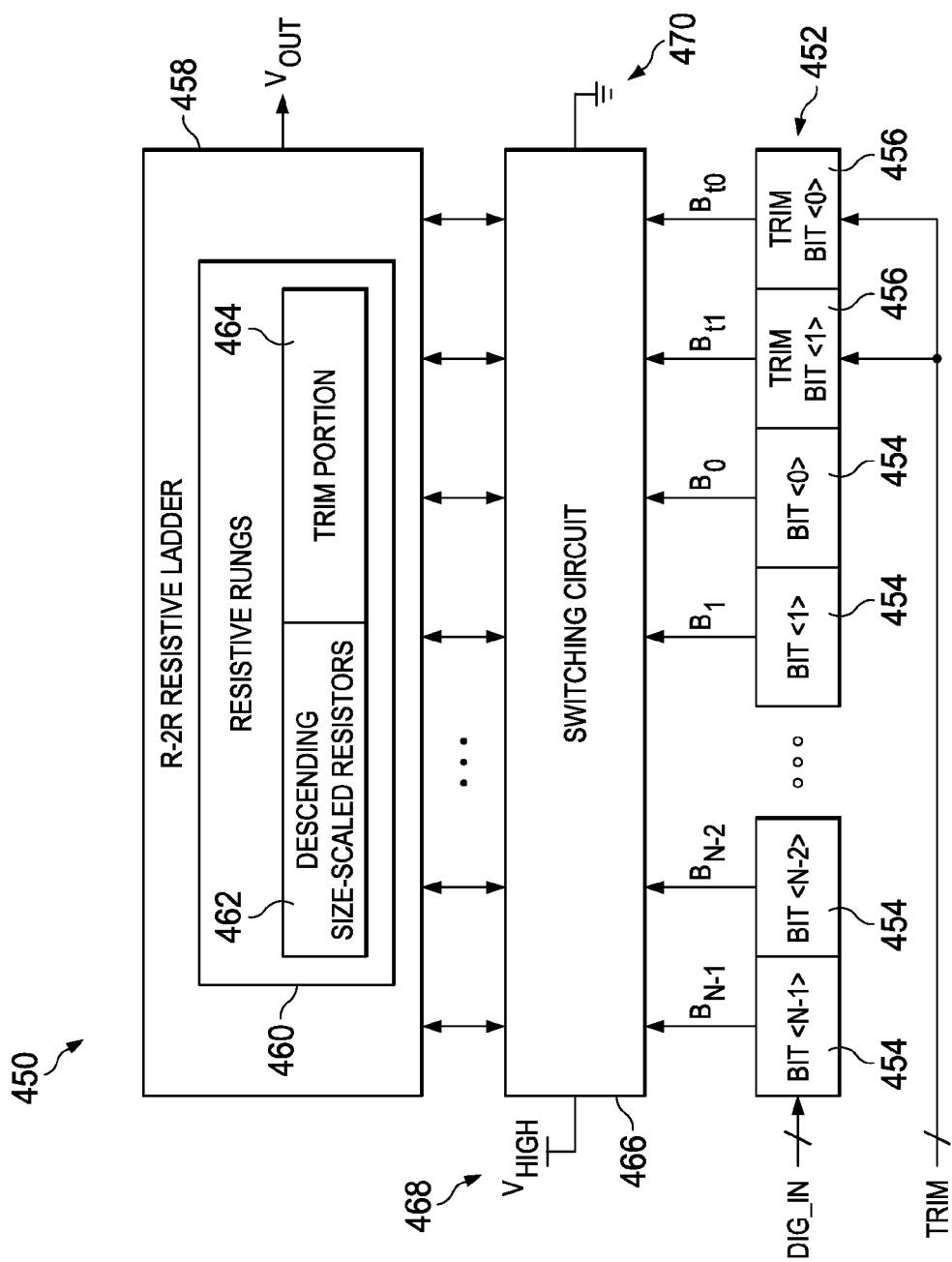
FIG. 10 illustrates yet another example of an R-2R DAC system in accordance with an aspect of the invention.

FIG. 10 illustrates another example of an R-2R DAC system 450 in accordance with an aspect of the invention. The R-2R DAC system 450 includes a digital register 452 that stores a digital input signal DIG_IN having N bits. In the example of FIG. 10, the digital register 452 is arranged as including storage cells 454 ranging from a most significant bit (MSB) of <N−1> to a least significant bit (LSB) of <0>. Thus, each of the cells 454 stores a digital bit, demonstrated in the example of FIG. 10 as $B_{N-1}$ to $B_0$, that corresponds to the binary value of each respective bit of the digital input signal DIG_IN. In addition, in the example of FIG. 10, the digital register 452 includes a plurality of trim cells 456, demonstrated as two in the example of FIG. 10. The trim cells 456 can each store trim one or more trim bits $B_{t1}$ and $B_{t0}$ in response to a digital trim signal TRIM.

The R-2R DAC system 450 also includes an R-2R resistive ladder 458. The R-2R resistive ladder 458 comprises a plurality of resistive rungs 460 that comprises a plurality of resistors 462. As an example, each of the resistive rungs 460 can include a pair of series resistors 462 that extend between a switching node and an intermediate node, and a single resistor 462 can interconnect the intermediate nodes of adjacent pairs of the resistive rungs 460 of at least a portion of the R-2R resistive ladder 458. The resistors 462 can be poly-silicon resistors (e.g., thin-film resistors). In the example of FIG. 10, the resistive rungs 460 can also include a trim portion 464. As an example, the trim portion 464 can include a portion of the resistive rungs 460 that are binary down-scaled from the LSB, and thus each contribute less than the analog magnitude of the LSB to the magnitude of the analog output voltage $V_{OUT}$.

The R-2R DAC system 450 further includes a switching circuit 466 that is configured to connect each of the resistive rungs 460 of the R-2R resistive ladder 458 to one of a high-voltage rail 468, demonstrated in the example of FIG. 10 as having a voltage $V_{HIGH}$, and a low-voltage rail 470, demonstrated in the example of FIG. 10 as ground. The switching of each of the resistive rungs 460 of the R-2R resistive ladder 458 can be in response to the values of the digital bits $B_{N-1}$ through $B_0$ and the trim bits $B_{t1}$ and $B_{t0}$ stored in the digital register 452. For example, the switching circuit 466 can include a plurality of drivers configured to drive switching signals for controlling a set of switches for each of the plurality of resistive rungs 460 of the R-2R resistive ladder 458. Therefore, based on the coupling of the resistive rungs 460 to the high or low-voltage rails 468 and 470, the R-2R DAC circuit 450 generates the analog output voltage $V_{OUT}$ corresponding to the digital value of the digital input signal DIG_IN.

As an example, all of the resistors 462 in the R-2R resistive ladder 458 can have nominally the same resistance. However, similar to as described above in the example of FIG. 1, the resistors 462 are demonstrated in the example of FIG. 10 as being descending size-scaled resistors 462 in a direction from the MSB to the LSB. As an example, the resistors 462 in one or more of the resistive rungs 460 corresponding to a respective one or more of the MSBs of the digital input signal DIG_IN can have the same physical size. As an example, the physical size of the resistors 462 of the one or more MSBs of the digital input signal DIG_IN can be less than a required specific physical size for maintaining a sufficient DNL error (e.g., within approximately +/−0.5 an analog magnitude of the LSB) at a given transition of the digital input signal DIG_IN. Thus, the generation of the analog output voltage $V_{OUT}$ in response to the digital input signal DIG_IN could have a DNL error of greater than approximately +/−0.5 the analog magnitude of the LSB at the transition from DIG_IN='0111111111' to DIG_IN='1000000000'. However, the resistive rungs 462 of the trim portion 464 can each be coupled to either the high-voltage rail 468 or the low-voltage rail 470 to trim the analog output voltage $V_{OUT}$ by an amount that is sufficient to substantially reduce the DNL error to within approximately +/−0.5 the analog magnitude of the LSB at the transition. In other words, the DNL performance degradation caused by using smaller physical size resistors 462 associated with one or more MSBs of the digital input signals DIG_IN is compensated by the trim portion which is implemented with minimum size resistors. Thus, the overall area of the R-2R DAC system 450 is substantially reduced. The resistors 462 in the remaining resistive rungs 460 can have a physical size that is descending size-scaled from the resistive rungs corresponding to the one or more MSBs down to the LSB, such as by a power of two or other decreasing function, down to a minimum fabrication size at a poly-silicon resistor 460. As a result, the silicon area of the R-2R DAC system 450 can be substantially reduced based on the significant decrease in the physical size of the resistors 462 resulting from the descending size-scaling.

Figure 11:
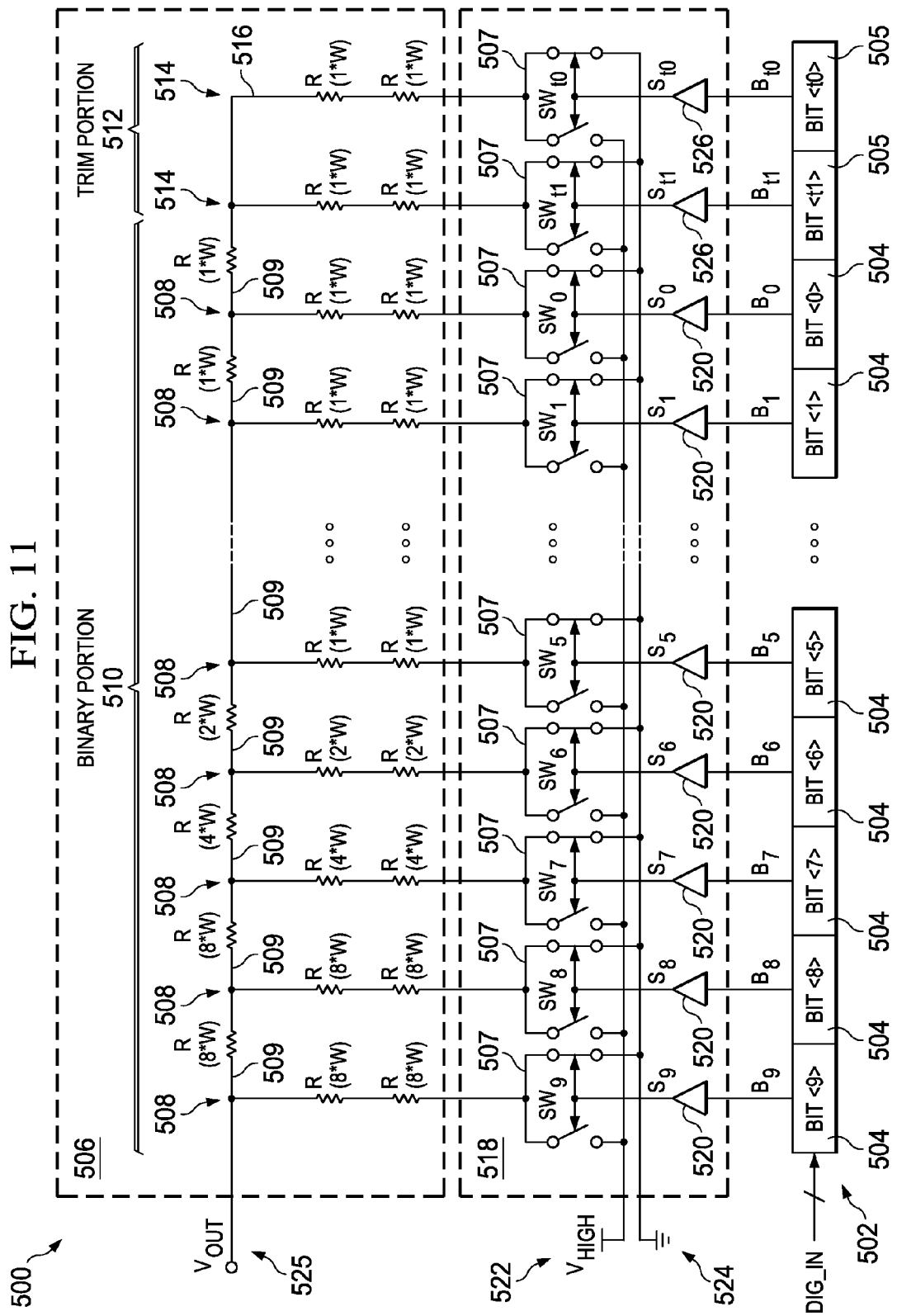
FIG. 11 illustrates yet a further example of an R-2R DAC circuit in accordance with an aspect of the invention.

FIG. 11 illustrates an example of an R-2R DAC circuit 500 in accordance with an aspect of the invention. The R-2R DAC circuit 500 includes a digital register 502 that receives a 10-bit digital input signal DIG_IN. The digital register 502 can be a portion of a memory structure, such as any of a variety of RAM structures. Thus, each of the bits of the digital input signal DIG_IN is stored in a corresponding memory cell 504 of the digital register 502. In the example of FIG. 11, the memory cells 504 of the digital register 502 are arranged for storing bits from an MSB of <9> to an LSB of <0>. Thus, each of the memory cells 504 generates a digital bit signal, demonstrated in the example of FIG. 11 as $B_9$ to $B_0$, that corresponds to the binary value of each of the respective ten bits of the digital input signal DIG_IN. In addition, the digital register 502 also includes two trim cells 505. The trim cells 505 can each store a trim bit <t1> and <t0> corresponding to bits $B_{t1}$ and $B_{t0}$ of a digital trim signal TRIM. For example, the trim signal TRIM can be provided to latch the digital value of the trim bits $B_{t1}$ and $B_{t0}$ in the trim cells 505.

The R-2R DAC circuit 500 also includes an R-2R resistive ladder 506. The R-2R resistive ladder 506 comprises a plurality of resistive rungs 508 that comprises a plurality of resistors, demonstrated in the example of FIG. 11 as "R". In the example of FIG. 11, the resistive rungs 508 extend between a switching node 507 and an intermediate node 509. Adjacent pairs of the intermediate nodes 509 are each separated by a single resistor R, and each of the resistive rungs 508 includes a pair of series resistors R. As an example, the resistors R can be poly-silicon resistors (e.g., thin-film resistors). Each of the resistors R can have approximately equal resistance.

In addition, the R-2R resistive ladder 506 includes a binary portion 510 and a trim portion 512. The binary portion 510 is demonstrated in the example of FIG. 11 as being configured substantially similar to the R-2R resistive ladder 56 of the example of FIG. 2. In the example of FIG. 11, the trim portion 512 includes two trim rungs 514 that likewise each include a pair of series resistors R. Both of the trim rungs 514 are interconnected between respective switching nodes 507 and a node 516. The arrangement of the trim portion 512 relative to the respective bits of the digital input signal DIG_IN is such that each of the trim rungs 514 contributes an analog magnitude of ½ an LSB to the magnitude of the analog output voltage $V_{OUT}$. It is to be understood that the R-2R DAC system 500 is not limited to two trim rungs 514, but could include any number of one or more trim rungs 514.

The R-2R DAC circuit 500 further includes a switching circuit 518. The switching circuit 518 includes a plurality of drivers 520 that are configured to buffer the digital bit signals $B_9$ through $B_0$ to generate respective switching signals $S_9$ through $S_0$. The switching signals $S_9$ through $S_0$ are provided to respective sets of switches $SW_9$ through $SW_0$. In the example of FIG. 11, the switches $SW_9$ through $SW_0$ are configured to connect each of the resistive rungs 508 of the R-2R resistive ladder 506 to one of a high-voltage rail 522, demonstrated in the example of FIG. 11 as having a voltage $V_{HIGH}$, and a low-voltage rail 524, demonstrated in the example of FIG. 11 as ground. For example, a logic-high binary value of the switching signals $S_9$ through $S_0$ can activate the respective switches $SW_9$ through $SW_0$ to couple the respective resistive rungs 508 to the high-voltage rail 522. Conversely, a logic-low binary value of the switching signals $S_9$ through $S_0$ can activate the respective switches $SW_9$ through $SW_0$ to couple the respective resistive rungs 508 to the low-voltage rail 524. Therefore, based on the coupling of the resistive rungs 508 to the high or low-voltage rails 522 and 524, the R-2R DAC circuit 500 generates a corresponding analog output voltage $V_{OUT}$ at an output 525 based on the digital value of the digital input signal DIG_IN.

As described above, the binary portion 510 of the R-2R resistive ladder 506 is configured substantially similar to the R-2R resistive ladder 56 in the example of FIG. 2. Specifically, a portion of the resistive rungs 508 are descending size-scaled from a plurality of MSBs to the LSB, down to a minimum fabrication size at the resistive rung 508 corresponding to the bit <5> of the digital input signal DIG_IN. However, in the example of FIG. 11, the resistors R in the resistive rungs 508 corresponding to the two MSBs of the digital input signal DIG_IN (i.e., bits <9> and <8>) both have a physical size of (8*W). As described in the example of FIGS. 2 through 4, it is determined that, for the 10-bit R-2R DAC circuit 50, the minimum physical size of the resistors R in the resistive rung 58 corresponding to the MSB of the digital input signal DIG_IN is (16*W). Therefore, for the 10-bit R-2R DAC circuit 500 in the example of FIG. 11, the binary portion 510 may have a DNL error of greater than +/−0.5 an analog magnitude of the LSB at a given transition of the digital input signal DIG_IN, such as the transition demonstrated in the example of FIG. 3.

The switching circuit 518 also includes a pair of drivers 526 that are configured to generate respective switching signals $S_{t1}$ and $S_{t0}$ based on the digital trim values $B_{t1}$ through $B_{t0}$. The switching signals $S_{t1}$ and $S_{t0}$ are provided to control respective sets of switches $SW_{t1}$ and $SW_{t0}$. Similar to the switches $SW_9$ through $SW_0$, the switches $SW_{t1}$ and $SW_{t0}$ are configured to connect each of the trim rungs 514 of the R-2R resistive ladder 506 to one of the high and low-voltage rails 522 and 524. Therefore, upon determining the effect of the DNL error on the magnitude of the analog output voltage $V_{OUT}$, such as at the transition demonstrated in the example of FIG. 3, the trim signal TRIM can be provided to trim cells 505, such that the trim rungs 514 can each be switched to one of the high and low-voltage rails 522 and 524 to compensate for the contribution of the DNL error. Accordingly, the R-2R DAC circuit 500 can be adjusted by the trim portion 512 to return the resolution of the R-2R DAC circuit 500 to within a predetermined fractional portion (e.g., +/−0.5 the analog magnitude of the LSB) at the transition demonstrated in the example of FIG. 3.

Similar to as described above in the example of FIG. 2, based on the descending size-scaling of the resistors R of the resistive rungs 508, the R-2R DAC circuit 500 can be fabricated at a substantially smaller area than conventional R-2R DAC circuits while maintaining high resolution of the analog output voltage $V_{OUT}$. In addition, the inclusion of the trim portion 512 allows fabrication of the resistors R in the resistive rung 508 corresponding to the MSB of the digital input signal DIG_IN at a physical size of (8*W), as opposed to (16*W) in the R-2R DAC circuit 50 in the example of FIG. 2. Therefore, the R-2R DAC circuit 500 can be fabricated on a silicon area that is less than one half the silicon area of the R-2R DAC circuit 50. In addition, the operation of the trim portion 512 can compensate for DNL error effects on the analog output voltage $V_{OUT}$ resulting from the smaller physical size of the resistors R in the resistive rung 508 corresponding to the MSB, thus maintaining the resolution of the analog output voltage $V_{OUT}$. Furthermore, because the total resistor area of all of the resistors R is decreased, INL error that can be related to wafer, stress, and temperature gradients can likewise be mitigated.

It is to be understood that the R-2R DAC circuit 500 is not intended to be limited by the example of FIG. 11. As an example, the R-2R DAC circuit 500 can be configured with a resolution of more or less than 10 bits and can still implement descending size-scaling of the resistors R of the R-2R resistive ladder 506, as well as the trim portion 512 and the equal physical size of the resistors R in the resistive rungs 508 corresponding to the MSBs. In addition, the trim portion 512 and trim cells 505 can include DNL error compensation based on more than two trim bits, depending on the resolution of the R-2R DAC circuit 500. Furthermore, the switching circuit 518 is not limited to the configuration demonstrated in the example of FIG. 11, but can be configured in any of a variety of ways to couple each of the resistive rungs 508 to the high and low-power voltage rails 522 and 524. Therefore, the R-2R DAC circuit 500 can be configured in any of a variety of ways based on the description herein.

Figure 12:
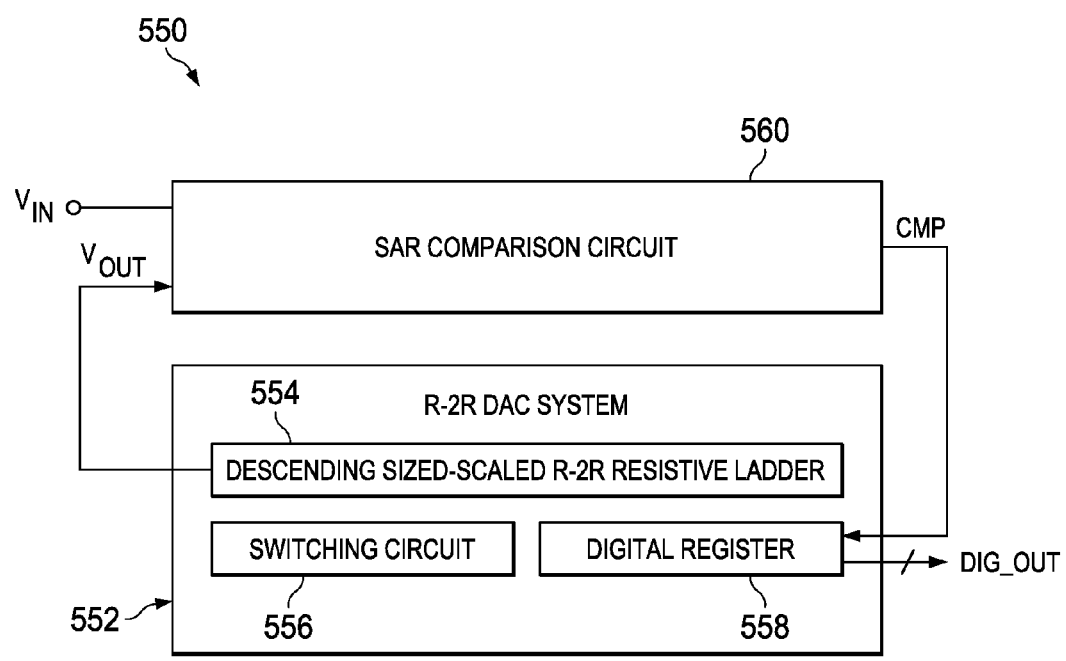
FIG. 12 illustrates an example of a successive approximation register (SAR) analog-to-digital converter (ADC) in accordance with an aspect of the invention.

FIG. 12 illustrates an example of a successive approximation register (SAR) analog-to-digital converter (ADC) system 550 in accordance with an aspect of the invention. The SAR ADC system 550 can be implemented in a variety of applications to generate a digital output signal DIG_OUT from an analog input signal V. As an example, the SAR ADC system 550 can be a 10-bit SAR ADC, such as can be implemented in a hard disk-drive (HDD) servo IC for position control of the HDD servo.

The SAR ADC system 550 includes an R-2R DAC system 552. The R-2R DAC system 552 can be configured substantially similar to any of the R-2R DAC systems 10, 200, or 450 in the examples of FIG. 1, 5, or 10, respectively or otherwise based on the description herein. For example, the R-2R DAC system 552 includes a descending size-scaled R-2R resistive ladder 554 having a plurality of resistive rungs that are each switched to one of a high and low-voltage rail by a switching circuit 556 based on a digital signal in a digital register 558. The descending size-scaled R-2R resistive ladder 554 can generate an analog voltage $V_{OUT}$.

As an example, the descending size-scaled R-2R resistive ladder 554 can include a resistive rung for each of the bits of the digital signal in the digital register 558, similar to as described above in the example of FIG. 2. Therefore, the resistive rung corresponding to the MSB can include resistors that have a physical size that is a minimum for maintaining a DNL error of approximately +/−0.5 an analog magnitude of the LSB of the digital input signal at the transition described above in the example of FIG. 3, and the remaining resistive rungs can have resistors that are descending size-scaled down to a minimum fabrication physical size. As another example, the descending size-scaled R-2R resistive ladder 554 can include both a binary portion and a linear portion, such as described above in the examples of FIGS. 6 and 8. Therefore, the resistors in the linear portion can all be the same size and can maintain the coupling of at least one resistive rung to each of the high and low-voltage rails at the transition described in the examples of FIGS. 3, 7, and 9, and the remaining resistive rungs can have resistors that are descending size-scaled down to a minimum fabrication physical size. As a further example, the descending size-scaled R-2R resistive ladder 554 can include a trim portion, similar to as described above in the example of FIG. 11. In such a configuration, the resistive rungs corresponding to a plurality of the MSBs can have resistors of approximately physical size that can be less than a size sufficient to maintain the DNL error to within +/−0.5 the analog magnitude of the LSB of the digital input signal, and the remaining resistive rungs can have resistors that are descending size-scaled down to a minimum fabrication physical size.

The SAR ADC system 550 also includes an SAR comparison circuit 560. The SAR comparison circuit 560 is configured to compare the input voltage $V_{IN}$ with the output voltage $V_{OUT}$ that is provided from the R-2R DAC system 552 to generate a comparison signal CMP. As an example, the SAR comparison circuit 560 can include at least one capacitor/amplifier arrangement that is configured in a sample-and-hold arrangement and a comparator. During a sampling phase, the input voltage $V_{IN}$ can be sampled onto a capacitor and the associated amplifiers can be switched to short their respective inputs and outputs, such as to cancel offset and low-frequency noise. In a conversion phase, the comparator compares the sampled input voltage $V_{IN}$ with the output voltage $V_{OUT}$ from the R-2R DAC system 552 to generate the comparison signal CMP. The comparison signal CMP is provided to the digital register 558 to update each of the digital bits individually, such one bit for each clock period. Therefore, the digital signal in the digital register approaches a closest representation of the analog input $V_{IN}$. The digital signal is output from the digital register 558 as the digital output signal DIG_OUT, and the SAR ADC system 550 can be ready for the next sample and conversion phase.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A digital-to-analog converter (DAC) system comprising:
   a resistive ladder comprising a plurality of resistors having an approximately equal resistance and being arranged in a respective plurality of resistive rungs between a first end of the resistive ladder and a second end of the resistive ladder, the first end of the resistive ladder being coupled to an output, at least one portion of the plurality of resistors between the first end and the second end of the resistive ladder having a physical size that is descending size-scaled in a direction from the first end of the resistive ladder to the second end of the resistive ladder; and
   a switching circuit that is configured to connect each of the plurality of resistive rungs to one of a first voltage and a second voltage based on a binary value of a digital input signal to generate a corresponding analog output voltage at the output,
   wherein the at least one portion of the plurality of resistors are descending size-scaled in the direction from the first end of the resistive ladder to the second end of the resistive ladder by powers of two down to a minimum fabrication process size.

2. The system of claim 1, wherein the plurality of resistive rungs comprises N resistive rungs, where N is a positive integer corresponding to a quantity N of bits of the digital input signal, the digital input signal comprising a plurality of bits ranging from a most significant bit (MSB) to a least significant bit (LSB).

3. The system of claim 2, wherein each of the resistors in a respective one of the plurality of resistive rungs corresponding to the MSB of the digital input signal has a physical size that is configured for maintaining a differential non-linearity (DNL) error of approximately a predetermined fractional part of an analog magnitude of the LSB of the digital input signal at an occurrence of a transition of the digital input signal between a first logic state in which the MSB is asserted and all other bits of the digital input signal are de-asserted and a second logic state in which the MSB is de-asserted and all other bits of the digital input signal are asserted.

4. A successive approximation register (SAR) analog-to-digital converter (ADC) comprising the DAC system of claim 1, the SAR ADC comprising an SAR ADC comprising an SAR comparison circuit configured to compare the analog output voltage with an analog input signal to generate a digital output signal as a digital representation of the analog input signal, the digital output signal corresponding to the digital input signal to the DAC system.

5. A digital-to-analog converter (DAC) system comprising:
   a resistive ladder comprising a plurality of resistors having an approximately equal resistance and being arranged in a respective plurality of resistive rungs between a first end of the resistive ladder and a second end of the resistive ladder, the first end of the resistive ladder being coupled to an output, at least one portion of the plurality of resistors between the first end and the second end of the resistive ladder having a physical size that is descending size-scaled in a direction from the first end of the resistive ladder to the second end of the resistive ladder; and
   a switching circuit that is configured to connect each of the plurality of resistive rungs to one of a first voltage and a second voltage based on a binary value of a digital input signal to generate a corresponding analog output voltage at the output,
   wherein the resistive ladder comprises a linear portion that is associated with a plurality of most significant bits (MSBs) of the digital input signal, the linear portion of the resistive ladder comprising a number of resistive rungs that is greater than the plurality of MSBs, and
   wherein the switching circuit comprises logic configured to maintain connection of at least one resistive rung of the linear portion to the first voltage and to maintain connection of at least one other resistive rung of the portion of the plurality of resistive rungs to the second voltage at an occurrence of a transition of the digital input signal between any possible logic states.

6. The system of claim 5, wherein the plurality of MSBs comprises N MSBs of the digital input signal, where N is a positive integer, and wherein the logic comprises logic gates configured to convert switching signals corresponding to the N MSBs to connect each of ($2^N-1$) resistive rungs corresponding to the linear portion of the resistive ladder concurrently to one of the first voltage and the second voltage.

7. The system of claim 6, wherein N has a value that is equal to one of 2 and 3.

8. The system of claim 5, wherein each of the resistors of the linear portion of the resistive ladder have an approximately equal physical size.

9. The system of claim 5, wherein the resistive ladder further comprises at least one trim resistive rung that is connected to one of the first voltage and the second voltage in response to a digital trim signal to adjust a magnitude of the analog output voltage by a fractional portion of a corresponding analog magnitude of a least significant bit of the digital input signal.

10. The system of claim 9, wherein respective resistors of a portion of the plurality of resistive rungs corresponding to a plurality of the most significant bits (MSBs) of the digital input signal have an approximately equal physical size.

11. The system of claim 5, wherein the resistive ladder comprises an R-2R resistive ladder in which each of the plurality of resistive rungs includes two of the plurality of resistors connected between the switching system and an end node, a given one of the plurality of resistors interconnecting the end nodes of at least one adjacent pair of resistive rungs.

12. An R-2R digital-to-analog converter (DAC) system comprising:
   a digital register configured to receive a digital input signal having a plurality X of bits, where X is a positive integer;
   an R-2R resistive ladder comprising a plurality of resistors having an approximately equal resistance and being arranged in a respective plurality of resistive rungs, each of the plurality of resistive rungs being connected between a switching node and a respective second node, the second node of at least one adjacent pair of the plurality of resistive rungs being connected by one of the plurality of resistors, at least a portion of the plurality of resistors in the R-2R resistive ladder having a physical size that is descending size-scaled in a given direction between ends of the resistive ladder; and
   a switching circuit comprising a plurality of switches configured to connect each of the plurality of resistive rungs to one of a first voltage and a second voltage in response to respective bits in the digital input signal, wherein the plurality of resistive rungs comprises X resistive rungs, each of the plurality of resistive rungs being associated with a respective one of the X bits of the digital input signal, and wherein each of the plurality of resistors in the resistive rung corresponding to the MSB of the digital input signal has a physical size that is configured for maintaining a differential non-linearity (DNL) error of a fractional portion of an analog magnitude of the LSB of the digital input signal at an occurrence of a transition of the digital input signal from a first code to a next sequential code.

13. The system of claim 12, wherein the R-2R resistive ladder comprises a linear portion that is associated with N most significant bits (MSBs) of the digital input signal, where N is a positive integer, and wherein the linear portion comprises M resistive rungs, where M is equal to $(2^N-1)$, and wherein the switching circuit comprises a logic converter configured to maintain connection of at least one of the M resistive rungs to the first voltage and to maintain connection of the at least one other of the M resistive rungs to the second voltage at an occurrence of a transition of the digital input signal between a first logic state in which the MSB is asserted and all other bits of the digital input signal are de-asserted and a second logic state in which the MSB is de-asserted and all other bits of the digital input signal are asserted.

14. The system of claim 13, wherein each of the resistors associated with the linear portion of the resistive ladder have an approximately equal physical size.

15. The system of claim 12, wherein respective resistors of a portion of the plurality of resistive rungs corresponding to a plurality of MSBs of the digital input signal have an approximately equal physical size, and wherein the R-2R resistive ladder further comprises at least one trim resistive rung that is switched to one of the first voltage and the second voltage in response to a digital trim signal that is loaded into the digital register to adjust a magnitude of the analog output voltage by a fractional portion of a corresponding analog magnitude of a least significant bit (LSB) of the digital input signal.

16. An R-2R digital-to-analog converter (DAC) system comprising:

a digital register configured to store a digital input signal having a plurality X of bits ranging from a most significant bit (MSB) to a least significant bit (LSB), where X is a positive integer;

a binary R-2R resistive ladder comprising a plurality of resistive rungs, each of the plurality of resistive rungs comprising a pair of series resistors connected between a respective switching node and a respective second node, the respective second nodes of at least some adjacent pairs of the plurality of resistive rungs being interconnected by an interconnecting resistor, each of the series resistors and interconnecting resistors in the resistive ladder having an approximately equal resistance, the series resistors and interconnecting resistors of at least a portion of the plurality of resistive rungs having a physical size that decreases in a direction from the MSB to the LSB; and a switching circuit comprising:

a plurality of drivers, each of the plurality of drivers being configured to generate a switching signal that is based on a value of a respective one of the X bits of the digital input signal in the digital register; and a plurality of switches configured to connect the switching node of each of the plurality of resistive rungs to one of a first voltage and a second voltage based on the switching signal provided by a respective one of the plurality of drivers to generate an analog output voltage at an output of the resistive ladder.

17. The system of claim 16, wherein the R-2R resistive ladder comprises a linear portion that is associated with N of the MSBs of the digital input signal, where N is a positive integer, and wherein the plurality of resistive rungs comprises M resistive rungs, where M is a positive integer that is equal to $(2^N-1)$, and wherein the switching circuit comprises a logic converter configured to maintain connection of at least one of the M resistive rungs to the first voltage and to maintain connection of at least one other of the M resistive rungs to the second voltage at an occurrence of a transition of the digital input signal between a first logic state in which the MSB is asserted and all other bits of the digital input signal are de-asserted and a second logic state in which the MSB is de-asserted and all other bits of the digital input signal are asserted.

18. The system of claim 16, wherein respective resistors of a portion of the plurality of resistive rungs corresponding to a plurality of MSBs of the digital input signal have an approximately equal physical size, and wherein the R-2R resistive ladder further comprises at least one trim resistive rung that is connected to one of the first voltage and the second voltage in response to a digital trim signal that is loaded into a trim register to adjust a magnitude of the analog output voltage by a fractional portion of a corresponding analog magnitude of the LSB of the digital input signal.

* * * * *